(12) United States Patent
Yerazunis et al.

(10) Patent No.: US 12,428,262 B2
(45) Date of Patent: Sep. 30, 2025

(54) TOUCHLESS ELEVATOR USER INTERFACE

(71) Applicant: Mitsubishi Electric Research Laboratories, Inc., Cambridge, MA (US)

(72) Inventors: William Yerazunis, Acton, MA (US); Aleef Mahmud, Boston, MA (US); Brian Lee, Buena Park, CA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 1397 days.

(21) Appl. No.: 17/062,620

(22) Filed: Oct. 4, 2020

(65) Prior Publication Data

US 2022/0106159 A1  Apr. 7, 2022

(51) Int. Cl.
*B66B 1/52* (2006.01)
*B66B 1/46* (2006.01)
*B66B 3/00* (2006.01)
*H03K 17/94* (2006.01)

(52) U.S. Cl.
CPC .............. *B66B 1/461* (2013.01); *B66B 1/468* (2013.01); *B66B 1/52* (2013.01); *B66B 3/004* (2013.01); *H03K 17/941* (2013.01); *B66B 2201/4638* (2013.01); *H03K 2217/94036* (2013.01); *H03K 2217/960755* (2013.01)

(58) Field of Classification Search
CPC ... B66B 1/468; B66B 1/52; B66B 2201/4638; B66B 2217/960755
See application file for complete search history.

(56) References Cited

U.S. PATENT DOCUMENTS

| 10,078,371 | B1* | 9/2018 | Sivertsen | G06F 3/0325 |
| 2007/0164756 | A1* | 7/2007 | Lee | H03K 17/962 324/662 |
| 2016/0103500 | A1* | 4/2016 | Hussey | G06F 3/017 345/173 |
| 2017/0108968 | A1* | 4/2017 | Roziere | G06F 3/0425 |
| 2019/0152433 | A1* | 5/2019 | Cumbo | G07C 9/00714 |

* cited by examiner

*Primary Examiner* — Rina I Duda
(74) *Attorney, Agent, or Firm* — Gene Vinokur

(57) ABSTRACT

Systems and methods having a touchless operating panel with buttons and an electronic circuit (EC). The system including a proximity sensor (PS) associated with an associated button and positioned proximate thereto. The PS arranged to generate a button detection zone around the associated button and detect a presence within the button detection zone. When the PS detects a presence of an object within the button detection zone in a time period, the EC receives proximity values about the detection from the PS. The EC detects if activation of the PS is intentional or unintentional, based on inputting into an activation assessment module, the received proximity values and any other proximity values received from one or more other PSs. When a detection is made that the PS is intentionally activated regarding the presence of the object within the button detection zone. The EC generates and emits a command action.

19 Claims, 26 Drawing Sheets

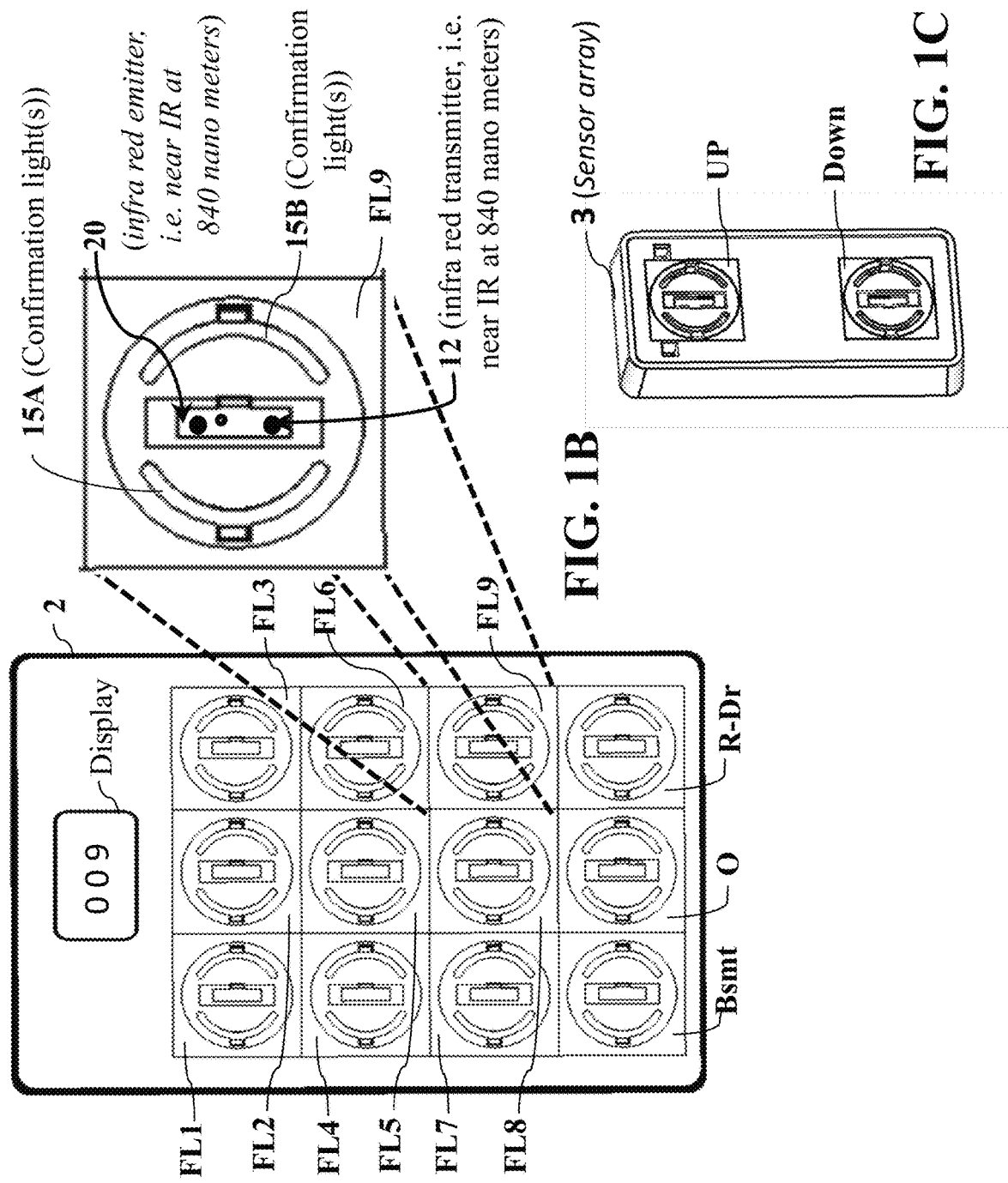

(Select floor by desired sensor number with "TWO light beams A & B" with FINGER)

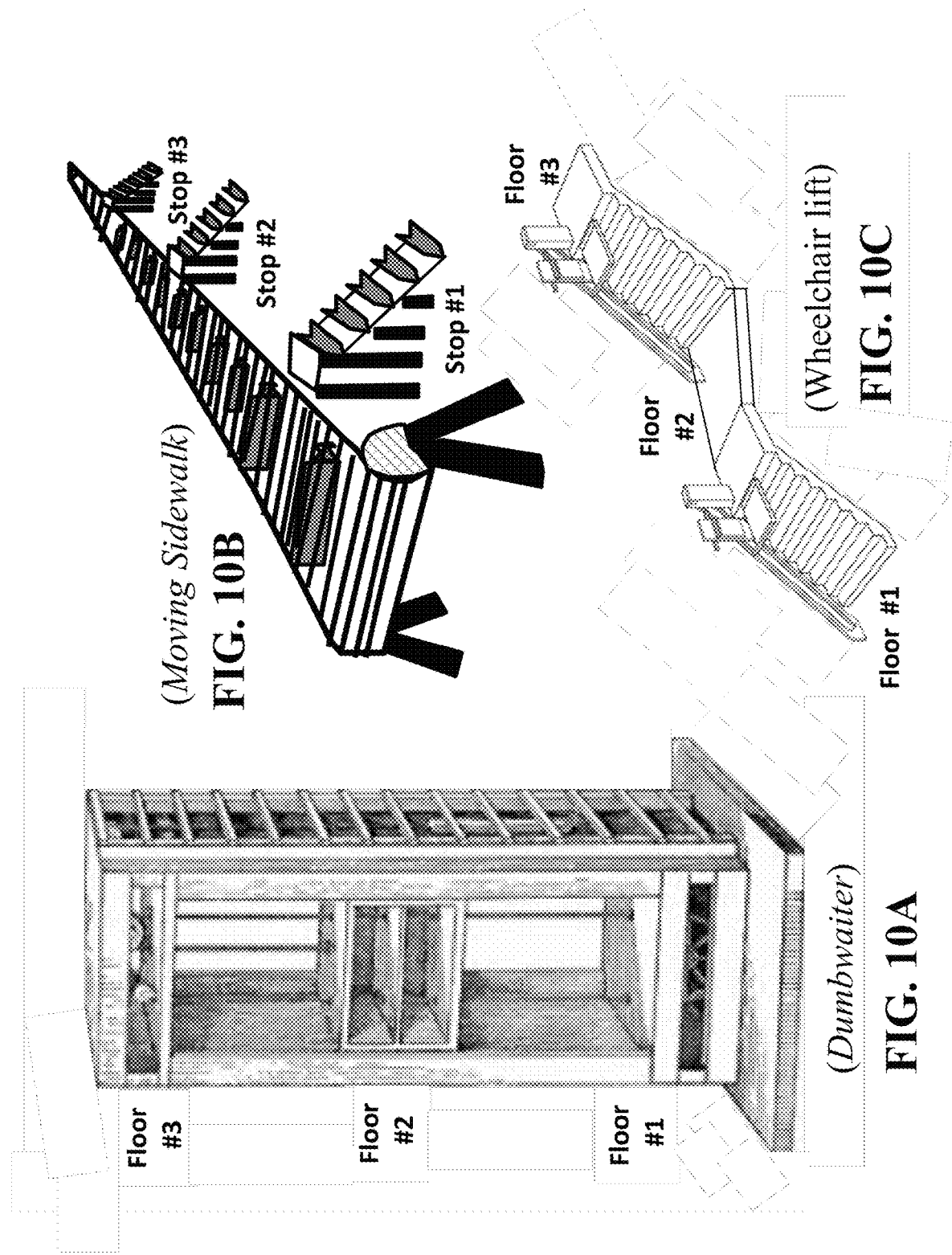

TOUCHLESS ELEVATOR USER INTERFACE

The present disclosure relates generally to elevator user interface systems, and more particularly to touchless elevator user interface systems to activate elevator services without the need to touch an elevator panel or elevator buttons.

BACKGROUND

Conventional elevator hall call buttons utilize microstroke mechanical switches, other conventional methods use proximity sensing, and still other conventional methods use optical patterns. However, conventional call buttons are complicated mechanical structures having a large number of parts, thereby being costly to manufacture in contrast with the function served, and being subject to mechanical wear.

Conventional buttons require some sort of human contact. In order to register an elevator call, some sort of human contact is required, i.e. thumb, finger or other equally sized human part must actually be targeted directly on the button. These types of conventional manually-actuated switches are sources for the spread of communicable diseases or the spread of harmful substances to humans. An infected or contaminated person can press a particular conventional elevator switch at one point in time, and, at a later point in time, another person may become infected or contaminated by manually contacting the particular elevator switch.

For example, such conventional buttons have ridges and crevices which not only accumulate grime and bacteria but also make it difficult to clean them. The foregoing problems are compounded in environments such as doctor's offices and hospitals, as well as in factories where work is performed, and bacteria and filth are passed from one passenger via the elevator button and hence to other passengers. Because there is currently an outbreak of respiratory disease caused by a novel coronavirus. The virus has been named "severe acute respiratory syndrome coronavirus 2" (SARS-CoV-2) and the disease it causes has been named "Coronavirus Disease 2019" (COVID-19). In January, 2020, the U.S. Department of Health and Human Services (HHS) issued a declaration of a public health emergency related to COVID-19 and mobilized the Operating Divisions of HHS In addition, in March, 2020, the President declared a national emergency in response to COVID-19. The COVID-19 virus can be contracted by a person touching a surface or object that has the virus on it and then touching their own mouth, nose, or possibly their eyes. For example, if a person in using elevator by touching an elevator button may be possible to contract the COVID-19 virus. For example, the Corona viruses on surfaces and objects can naturally live hours to days, before finally the virus dies.

The majority of COVID-19 patients infected with the virus experience mild flu-like symptoms. However, a significant minority experience moderate to severe respiratory symptoms, including shortness of breath and impaired oxygen saturation. These patients typically require hospitalization, and progress to being intubated and/or ventilator dependent. The percentage of COVID-19 patients who require hospitalization, and progress to being intubated and/or ventilator dependence climbs significantly with age, the presence of underlying diseases, the presence of secondary infection and elevated inflammatory indicators in the blood. Fatality is highest in the elderly, ranging from 3% to 27%, among persons aged 65-<84 years, respectively. Given the aggressive rate of spread of COVID-19, significant concern exists that the US healthcare system does not have the number of ventilators and/or ICU beds to meet the expected demand in the coining months. Therefore, to prevent the infection or contamination by a person using a switch in a publicly used environment, it would be desirable if a non-personal-contact electric switch were provided in a publicly used environment. Other publicly used environments where conventional manually-actuated switches are used include light switches in public buildings.

However, some conventional elevator approaches have "touchless" elevator controls which can include two types of methods, such as barrier systems, and smartphone-based systems. Barrier-based systems depend on the human elevator user carrying a stick-like barrier device to push the buttons; this device is often designed like a large stylized antique "flag" key (of the type used for pre-Yale style lever-tumbler locks). This flag key has a protrusion that can also be used as a hook to pull open doors without the human user directly touching the presumably-contaminated door handle. However, among the many negative aspects of these approaches is that in order to use the elevator, the passenter needs the flag key.

Smartphone-based systems include propriority app-based systems that use an RF link, RFID token, or wireless WAN link, to wirelessly and touchlessly call an elevator via the user's smartphone (and incidentally allow destination dispatch optimization). However, among the many negative aspects of these approaches is that this depends on each user being pre-registered with the elevator management system and each user carrying a working smartphone with the app installed.

U.S. Pat. No. 4,716,992 discloses a car operating panel for an elevator system that includes a two-dimensional matrix array of six light emitters and six light receivers to provide switching for eight switching choices. However, there are multiple problems with this conventional approach, such that if only one of the six light emitters or one of the six light receivers malfunction, the entire system is compromised. For example, the malfunction may either have two or four switching choices that would be deactivated, depending upon whether a row or column of switching choices in the two-dimensional matrix were malfunctioning. To avoid multiple switch malfunctions if only one light emitter or one light receiver malfunctions, it would be desirable to provide non-personal-contact electric switches in a publicly used environment, such as an elevator, which do not employ a two-dimensional matrix array of light emitters and light receivers to actuate plural switches.

The present disclosure addresses the elevator contactless elevator button technological needs of today's elevator industries and other related technology industries, by solving the conventional problems of contactless operation of elevator systems, and addressing the COVID-19 pandemic, by producing touchless elevator user interface systems to activate elevator services without the need to touch an elevator panel or elevator buttons.

SUMMARY

The present disclosure relates generally to elevator user interface systems, and more particularly to touchless elevator user interface systems to activate elevator services without the need to touch an elevator panel or elevator buttons, while minimizing or eliminating accidental activations of the elevator calling and floor selection controls.

Some embodiments of the present disclosure, include a touchless device or a touchless car operating panel (touchless COP) for real-time contactless elevator service operation of an elevator. The touchless COP includes an operating panel with a sensor array including sensor elements corresponding to floor numbers serviced by the elevator. Each sensor element has a proximity sensor and a confirmation lamp, along with a sensor detection zone that the proximity sensor senses. The sensing of the proximity sensor is by emitting proximity values indicative of an object positioned within the sensor detection zone in order to detect the object. Wherein, an electronic circuit is configured to detect if the object is positioned in a single sensor element detection (SSED) zone associated with a single sensor element, or if the object is positioned in multiple sensor elements sensor detection (MSESD) zones associated with more than one sensor element. The detecting the of the object by the electronic circuit is based on identifying a first and second highest proximity values for all sensor elements in the sensor array. Applying a predetermined function to both the first and second highest proximity values to produce two logic values. Subtracting the two logic values to obtain a final test value. Wherein, if the final test value is greater than a predetermined final value threshold, then the object is detected as being in the SSED zone, and the electronic circuit generates and emits command actions to an elevator group control (EGC) unit to flash the confirmation lamp and send a floor dispatch to the floor associated with the sensor element having the highest proximity value.

In terms of a user utilizing the touchless COP, the user extends their hand toward a floor number having a sensor element along with extending their index finger, while their remaining fingers and thumb are held in a closed position. The user intended floor is activated by the index finger of the user. However in the prior art method approaches, the back of the user's hand and/or the other fingers and thumb of the user also activates or enter into, the adjacent sensor element detection zones, resulting in an unintentionally selection of the adjacent floor numbers and possible a rear door opening, a basement floor, or some other sensor element affiliations, which is highly undesirable, causing a delay in elevator services and frustration by the passengers.

In the present disclosure, an unintentional activation function is configured to identify when there is an unintended activation of more than one sensor elements in the sensor array by a user or passenger of the elevator utilizing the elevator services. Wherein multiple sensor elements are triggered, the system determines such multiple concurrent sensor element activations as unintentional activations and disregards such unintentional activations events. For example, if a user stands too close to the touchless COP and thereby inadvertently activates multiple sensor elements in the sensor array with a part of their body, such as their elbow, or with an object the user is holding, i.e. an umbrella, or some other object, these false multiple activations will be disregarded.

The unintentional activation function that determines multiple sensors concurrent activations is configured to eliminate using additional components within the system to make such determinations, by incorporating constraints on the system. Thus, at least some benefits can include minimizing or eliminating accidental activations of the elevator calling and floor selection controls, which results in an improved service to passengers due to eliminating such time consuming delay events to deliver elevator services more quickly to the passengers, and reduce passenger frustration with the elevator services, among other many benefits.

Some embodiments of the present disclosure utilize the proximity values (or an analog voltage representing the proximity value) of all the sensor element proximity values and identifies the highest two proximity values in the sensor array. Wherein a second closest proximity value from the sensor element is subtracted from the proximity value (or an analog voltage representing the proximity value) of the closest proximity value from sensor element, which is the intended floor request destination by the user. The resulting value is then compared against a predetermined threshold, and if greater than the predetermined threshold, then a request for the elevator to go to floor nine associated with sensor element is registered or activated to the elevator group controller, and the confirmation lamps or feedback lamps, usually LEDs, are illuminated to confirm the floor request by the user.

Alternatively, as an indication of user approaching the sensor detection area or zone of the sensor, the confirmation lamp can be configured to blink in longer durations while a user approaches the target zone or the sensor element detection zone. Upon the user positioning their finger or device within the target zone area for a predetermine duration time period, the confirmation lamp turns from blinking to fully illuminated, thus confirming to user, the desired request is recognized. Other aspects are contemplated such as audio sound, text displayed in the display, and the like. Although, what was later discovered from experimental testing is that some types of feedback may confuse user's while attempting to make a user request associated with the touchless COP, when no operator or other instructions are given or provided. For example, some testing showed that almost 50% of users were confused on an uninstructed first attempt having feedback with longer duration blinking of a light, wherein some users assumed that the feedback blinking was a final confirmation of the user's request. Whereas, the feedback blinking had been intended to assist while the users were attempting to position their finger within the intended user's request SSED zone. Thus, resulting in the users being frustrated when the system did not actually register their request. What was later learned is that if no feedback blinking is provided to the user while the user is making their user request, the user complete their request. Such that, when a confirmation lamp was used to confirm that the user had completed their user request, the tests showed results of over 80% of user's success on the user's uninstructed first attempt.

In particular it should be noted that if a person merely stands in the sensor detection areas or zones of multiple sensor elements in the sensor array, the resulting actions by conventional elevator approaches without an inter-sensor interference detection of the present disclosure, will register floor requests to many if not all floors, resulting in a highly undesirable and annoying event, causing elevator service delays along with frustrating passengers using the elevator services.

For touchless COP located in an elevator car, the touchless COP can be positioned approximate an in-car panel, and include a 0-9 keypad like a phone keypad, such that each floor includes a corresponding sensor element that makes up a sensor array. Other sensor elements can be included in the sensor array such as a basement floor, a rear door access along with other types of user related requests. In regard to a hall unit, the hall unit can be located in a hallway approximate an elevator door opening. The hall unit can include two sensor elements ("up" and "down" requests) that makes up the sensor array.

However, because wall space is extremely limited, for both on the touchless COP located in the elevator car, and the hallway plate or hall unit located approximate an elevator floor opening location, the sensor elements in the sensor array are restricted to being very crowded together. In fact, the sensor elements in the sensor array are crowded more closely than is optimal for many design operational concerns. Thus, some sensor elements (associated with elevator buttons), experience the unintentional or undesirable activations when a user attempts to request for a floor destination, which causes the elevator to go to unintentional or undesired floors, resulting in delays and aggravation for the passengers using the elevator services.

Practical Applications

Some practical applications the embodiments of the present disclosure can include contactless elevator operation for elevators, including but not limited to the elevators for passengers and/or goods/food. Other applications that the embodiments of the present disclosure can include keypad entry systems, access to operation of machines, conveyor systems, access to sensitive facillaties, i.e. medical supplies, server rooms, and the like.

According to an embodiment of the present disclosure, a system having a touchless operating panel with buttons and an electronic circuit, the touchless operating panel. The system including a proximity sensor associated with an associated button and positioned proximate thereto. The proximity sensor arranged to generate a button detection zone around the associated button and detect a presence within the button detection zone. Wherein, when a detection is made by the proximity sensor regarding a presence of an object within the button detection zone in a time period, the electronic circuit receives proximity values about the detection from the proximity sensor. Wherein, the electronic circuit detects if activation of the proximity sensor is intentional or unintentional, based on inputting into an activation assessment module, the received proximity values and any other proximity values received from one or more other proximity sensors for the time period. Wherein, when a detection is made that the proximity sensor is intentionally activated regarding the presence of the object within the button detection zone. The electronic circuit generates and emits at least one command action including button information that is related to the associated button within the button detection zone to a control unit.

According to another embodiment of the present disclosure, an elevator system having a touchless elevator operating panel with buttons and an electronic circuit, the touchless elevator operating panel. The touchless elevator operating panel including a proximity sensor associated with an associated button and positioned proximate thereto. The proximity sensor arranged to generate a button detection zone around the associated button and detect a presence within the button detection zone. Wherein, when a detection is made by the proximity sensor regarding a presence of an object within the button detection zone in a time period, the electronic circuit receives proximity values about the detection from the proximity sensor. Wherein, the electronic circuit detects if activation of the proximity sensor is intentional or unintentional, based on inputting into an activation assessment module, the received proximity values and any other proximity values received from one or more other proximity sensors for the time period. Wherein, when a detection is made that the proximity sensor is intentionally activated regarding the presence of the object within the button detection zone. The electronic circuit generates and emits at least one command action including button information that is related to the associated button within the button detection zone to an elevator group control (EGC) unit.

According to another embodiment of the present disclosure, a touchless device for real-time contactless elevator service operation of an elevator having an operating panel. The operating panel including a sensor array including sensor elements corresponding to floors serviced by the elevator. Each sensor element having a proximity sensor, such that a sensor detection zone of the proximity sensor senses by emitting proximity values indicative of an object positioned within the sensor detection zone to detect the object. An electronic circuit is configured to detect if the object is positioned in a single sensor element detection (SSED) zone, or if the object is positioned in multiple sensor elements sensor detection (MSESD) zone. Based on obtaining proximity values from all sensor elements in the sensor array. Identify a first and second highest proximity values and corresponding sensor identifications from all sensor element proximity values of the sensor array. Applying a predetermined function to both the first and second highest proximity values, yielding a first comparison value and a second comparison value. Such that the first comparison value and the second comparison value have a decreased dependence on proximity sensor-specific characteristics when compared to the first and second highest proximity values. Subtracting the first comparison value from the second comparison value to obtain a final test value. Such that if the final test value is greater than a predetermined final value threshold, then the object is considered as in the SSED zone, and the electronic circuit generates and emits at least one command action to an elevator group control (EGC) unit.

According to another embodiment of the present disclosure, a method for real-time contactless elevator service operation of an elevator. The method including using an operating panel having a sensor array with sensor elements corresponding to floors serviced by the elevator. Such that each sensor element includes a proximity sensor with a sensor detection zone that senses by emitting proximity values indicative of an object positioned within the sensor detection zone to detect the object. Detecting by an electronic circuit, if the object is positioned in a single sensor element detection (SSED) zone, or if the object is positioned in multiple sensor elements sensor detection (MSESD) zone. Based on obtaining proximity values from all sensor elements in the sensor array by the electronic circuit and identifying a first and second highest proximity values and corresponding sensor identifications from all sensor element proximity values of the sensor array. Applying a predetermined function to both the first and second highest proximity values, yielding a first comparison value and a second comparison value. Such that the first comparison value and the second comparison value have a decreased dependence on proximity sensor-specific characteristics when compared to the first and second highest proximity values. Subtracting the first comparison value from the second comparison value to obtain a final test value. Such that if the final test value is greater than a predetermined final value threshold, then the object is considered as in the SSED zone, and the electronic circuit generates and emits at least one command action to an elevator group control (EGC) unit.

According to another embodiment of the present disclosure, a non-transitory machine-readable medium including instructions stored thereon which, when executed by processing circuitry, configure the processing circuitry to perform operations for real-time contactless elevator service operation of an elevator. The method including using an operating panel having a sensor array with sensor elements corresponding to floors serviced by the elevator. Such that each sensor element includes a proximity sensor with a sensor detection zone that senses by emitting proximity values indicative of an object positioned within the sensor detection zone to detect the object. Detecting by an electronic circuit, if the object is positioned in a single sensor element detection (SSED) zone, or if the object is positioned in multiple sensor elements sensor detection (MSESD) zone. Based on obtaining proximity values from all sensor elements in the sensor array by the electronic circuit and identifying a first and second highest proximity values and corresponding sensor identifications from all sensor element proximity values of the sensor array. Applying a predetermined function to both the first and second highest proximity values, yielding a first comparison value and a second comparison value. Such that the first comparison value and the second comparison value have a decreased dependence on proximity sensor-specific characteristics when compared to the first and second highest proximity values. Subtracting the first comparison value from the second comparison value to obtain a final test value, such that if the final test value is greater than a predetermined final value threshold, then the object is considered as in the SSED zone, and the electronic circuit generates and emits at least one command action to an elevator group control (EGC) unit.

According to another embodiment of the present disclosure, a touchless device for real-time contactless elevator service operation of an elevator, having an operating panel. The operating panel including a sensor array including sensor elements corresponding to floors serviced by the elevator. Each sensor element having a proximity sensor, such that a sensor detection zone of the proximity sensor senses by emitting proximity values indicative of an object positioned within the sensor detection zone to detect the object. An electronic circuit is configured to detect if the object is positioned in a single sensor element detection (SSED) zone, or if the object is positioned in multiple sensor elements sensor detection (MSESD) zone. Based on obtaining proximity values from all sensor elements in the sensor array. Input obtained proximity values from all sensor elements into a pretrained neural network (PNN). Evaluate each layer of the pretrained PNN beginning with an input layer through each intermediate layer, consecutively, and then to a final layer, to yield outputs of, a SSED zone value, a MSESD zone value, and a no zone (NZ) value which indicates neither the SSED, or MSESD zone values. If the SSED zone value is greater than the NZ value, and if the SSED zone value is greater than the MSESD zone value, then the object is considered as in the SSED zone, and the electronic circuit generates and emits at least one command action to an elevator group control (EGC) unit.

According to another embodiment of the present disclosure, a touchless device for real-time contactless elevator service operation of an elevator, the elevator having an operating panel that includes an array of elevator floor markers including a set of floor markers corresponding to floor numbers. Wherein each floor marker includes a corresponding single marker element detection (SMED) zone. A sensor array including a first sensor element and a second sensor element. Wherein the first and the second sensor elements each include a sweep angle detection zone, such that each sweep angle detection zone cover the array of elevator floor markers. A memory includes a first sensor element lookup table. The first sensor element lookup table contains one entry per possible sweep angle value produced by the first sensor element, each entry contains one coefficient per floor marker in the set of floor markers, and each coefficient corresponds to an amount of energy detected within a floor marker SMED zone at the possible sweep angle value by the first sensor element during intentional selection by a user of that floor marker. A second sensor element lookup table. The second sensor element lookup table contains one entry per possible sweep angle value produced by the second sensor element, each entry contains one coefficient per floor marker in the set of floor markers, and each coefficient corresponds to an amount of energy detected within a floor marker SMED zone at the possible sweep angle value by the second sensor element during intentional selection by a user of that floor marker. A second memory for the first sensor element having a storage location for each floor number and the corresponding SMED zone for the set of floor markers. A third memory for the second sensor element having a storage location for each floor number and the corresponding SMED zone for the set of floor markers. An electronic circuit is configured to detect if the object is positioned in a SMED zone, or if the object is positioned in multiple marker element detection (MSMED) zones. Based on setting all storage locations in the second memory and the third memory to zero. Scan and record sweep angle values from the first and the second sensor elements in the sensor array. Using the first sensor element lookup table, for each recorded first sensor element sweep angle value obtain a corresponding entry in the first sensor element lookup table, and for each coefficient in that entry, and set the corresponding storage location in the second memory from a current value to a maximum value of the current value stored in the second memory or the coefficient from the first sensor element lookup table. Using the second sensor element lookup table, for each recorded second sensor element sweep angle value obtain a corresponding entry in the second sensor element lookup table, and for each coefficient in that entry, and set the corresponding storage location in the third memory from a current value to a maximum value of the current value stored in the third memory or the coefficient from the second sensor element lookup table. A fourth memory having a storage location for each floor number and corresponding SMED zone for the set of floor markers, wherein each storage location in the fourth memory is set to a value of a sum of the corresponding storage location in the second memory and the corresponding location in the third memory. Identify a first and second highest values in all the storage locations in the fourth memory. Subtract the second highest value from each of the value in each storage location in the fourth memory, if a result for any storage location is zero, then set that storage location to zero. Wherein if any value remaining in each storage location of the fourth memory exceeds a final value threshold, then the detected user finger or user object is considered to be within the corresponding floor marker SMED zone corresponding to the floor number, and the electronic circuit generates and emits at least one command action to an elevator group control unit.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 1B, is a schematic illustrating some components of some touchless COP embodiments, according to some embodiments of the present disclosure;

FIG. 1C is a schematic diagram illustrating a first touchless hallway operating panel (touchless HOP) embodiment that includes a configuration for contactless elevator service operation of an elevator with a single near IR proximity sensor, according to some embodiments of the present disclosure.

FIG. 10A is a schematic illustrating that the touchless COP embodiments can be adapted to a dumbwaiter system, according to some embodiments of the present disclosure;

FIG. 10B is a schematic illustrating that the touchless COP embodiments can be adapted to a moving sidewalk system, according to some embodiments of the present disclosure; and FIG. 10C is a schematic illustrating that the touchless COP embodiments can be adapted to a wheelchair lift system, according to some embodiments of the present disclosure.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

Figure 1A:
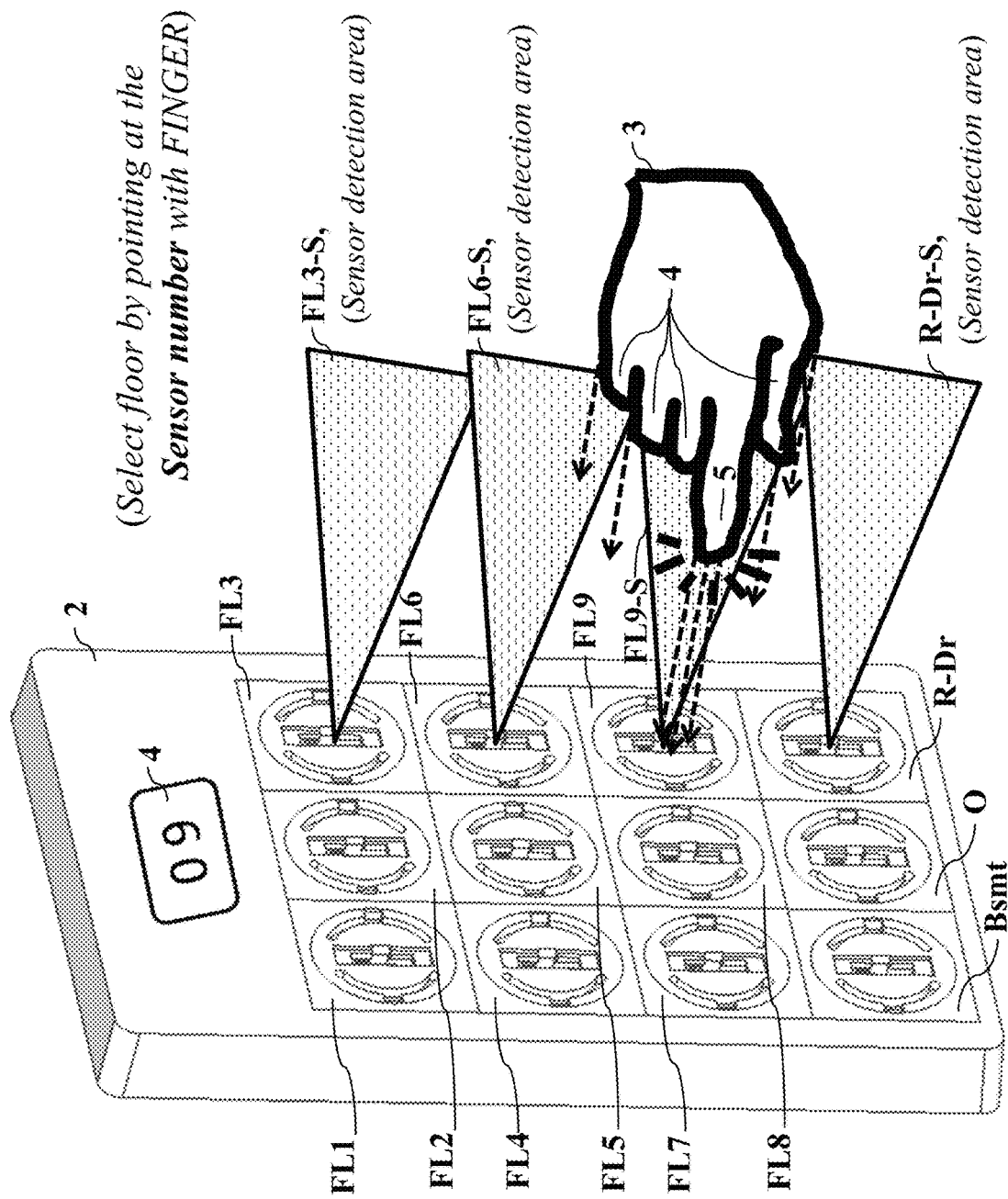
FIG. 1A is a schematic diagram illustrating a first touchless car operating panel (touchless COP) embodiment that includes a configuration for contactless elevator service operation of an elevator with a single near IR proximity sensor, according to some embodiments of the present disclosure.

FIG. 1A is a schematic diagram illustrating a first touchless car operating panel (touchless COP) embodiment that includes a configuration for contactless elevator service operation of an elevator with a single near IR proximity sensor, according to some embodiments of the present disclosure.

A touchless COP 2 can include a sensor array with sensor elements FL1-FL9, Bsmt, O, R-Dr. The sensor elements can represent floor numbers FL1-FL9, and other sensor elements such as a basement floor number (Bsmt), an (O) a zero for entering a security codes, and a rear door (R-Dr), that are operable to make requests by users of the elevator system. The floor entry sensor elements FL1-FL9, Bsmt, O, R-Dr may be floor selection elements with indicators thereon that provide information about destination and provide an ability to make elevator service requests to travel to a specific destination by the user. The design and specific configuration provided in FIG. 1A and other figures of the present disclosure are not intended to be limiting, but rather are provided for illustrative and explanatory purposes.

In order to assist passengers using the COP 2, the sensor elements FL1-FL9, Bsmt, O, R-Dr include a detection operational function that allow users/passengers to request a destination floor without having to physically touch the sensor element, i.e. or physically press an elevator button. Each sensor element FL1-FL9, Bsmt, O, R-Dr. includes a proximity sensor (not shown, see FIG. 1B) that projects a sensor detection zone FL3-S, FL6-S, FL9-S to detect a user's finger 5 or a user's object, such as a pencil, umbrella end (not shown), which is intended by the user to request a destination floor or a type of elevator service. Wherein the user extends their hand 3 toward an intended destination floor FL1-FL-9 represented as a sensor element FL1-FL9, Bsmt, O, R-Dr, such that the user's hand 3 enters within a sensor detection zone FL3-S, FL6-S, FL9-S, which is detected by the proximity sensor (not shown, see FIG. 1B) of the sensor element, to activate the sensor element.

The proximity sensors can be sensors arranged to detect a person's finger and/or an object that the user is holding if the user's finger is unavailable, which the user places in proximity or within the sensor detection zone. The sensor detection zone of the proximity sensor may be based on magnetic sensing, motion sensing, heat sensing, light sensing, capacitive sensing, RF sensing or other proximity aspects. As shown, the proximity sensor detection zone extends away from the sensor into the elevator car or hallway approximate an opening of an elevator. Contemplated is that the sensor detection zone for adjoining sensor elements, may possibly overlap, which could lead to activating more than one sensor element unintentionally. For example, a user's hand 3 includes other fingers and a thumb 4 that may unintendedly enter more than one sensor detection zone, which could activate more than one sensor element and cause an unintended activation of multiple sensor elements resulting in unintended multiple destination requests by the user. The embodiments of the COP 2 are designed and configured to address such a condition, see FIGS. 1C and 1D.

FIG. 1B is a schematic illustrating some components of a sensor element for the touchless COP, according to some embodiments of the present disclosure. For example, each sensor element FL1-FL9, Bsmt, O, R-Dr includes at least one proximity sensor having a near IR transmitter 20 and a near IR emitter, wherein some near IR proximity sensors, by non-limiting example, can be at about 840 nanometers. Confirmation lamp or lamps (not shown) can provide a signal to the user for confirming that the touchless COP system has recognized and is implementing the user's intended request for a destination floor, via confirmation lamp light ports 15A, 15B for light to pass through to be visible by users.

Referring to FIG. 1A and FIG. 1 B, the sensor array has sensor elements FL1-FL9, Bsmt, O, R-Dr, such that each sensor element contains a near-IR parallax-based proximity sensor and confirmation lamps for user feedback. Each sensor element may correspond one to one with a floor number FL1-FL9 or sensor elements may be used as a phone keypad dialer to enter multi-digit floor numbers, including basement level (Bsmt), rear door activation (R-Dr), via positions that would normally be a number sign and an asterisk on a phone dialer.

FIG. 1A shows that each sensor element FL1-FL9, Bsmt, O, R-Dr emits an IR beam that includes a sensor detection area or zone FL3-S, FL6-S, FL9-S, for a scan and record period of time, i.e. approximately a $1/20^{th}$ of a second. The user extends their hand 3 of FIG. 1B to select a floor FL1-FL9 of FIG. 1B, such that each floor FL1-FL-9 is represented by a corresponding sensor element.

FIG. 1C is a schematic diagram illustrating a first touchless hallway operating panel (touchless HOP) embodiment that includes a configuration for contactless elevator service operation of an elevator with a single near IR proximity sensor, according to some embodiments of the present disclosure. As with FIG. 1A and FIG. 1B, the sensor array 3 with sensor elements UP, DOWN, include an UP-sensor element and a DOWN-sensor element. In terms of design, configuration and operation, the hallway sensor elements are like the sensor elements for the touchless COP. For example, the sensor elements UP, DOWN are directional call buttons essentially, such as those located on hall call panels position in hallways approximate an opening of an elevator, or may be floor entry buttons, such as those located on elevator car operating panels. The direction call buttons or sensor elements UP, DOWN, may be direction buttons (e.g., have an arrow indicator) to make elevator service requests for travel in the indicated direction. Further, a hall or hallway call controller of the present disclosure is in communication with near-IR proximity sensors, such that each proximity sensor is in communication with confirmation lamps or feedback lights. Since there are only two hall-call destinations possible—"UP" and "DOWN" only two sensor elements are needed and comprise a sensor array.

Figure 1D:
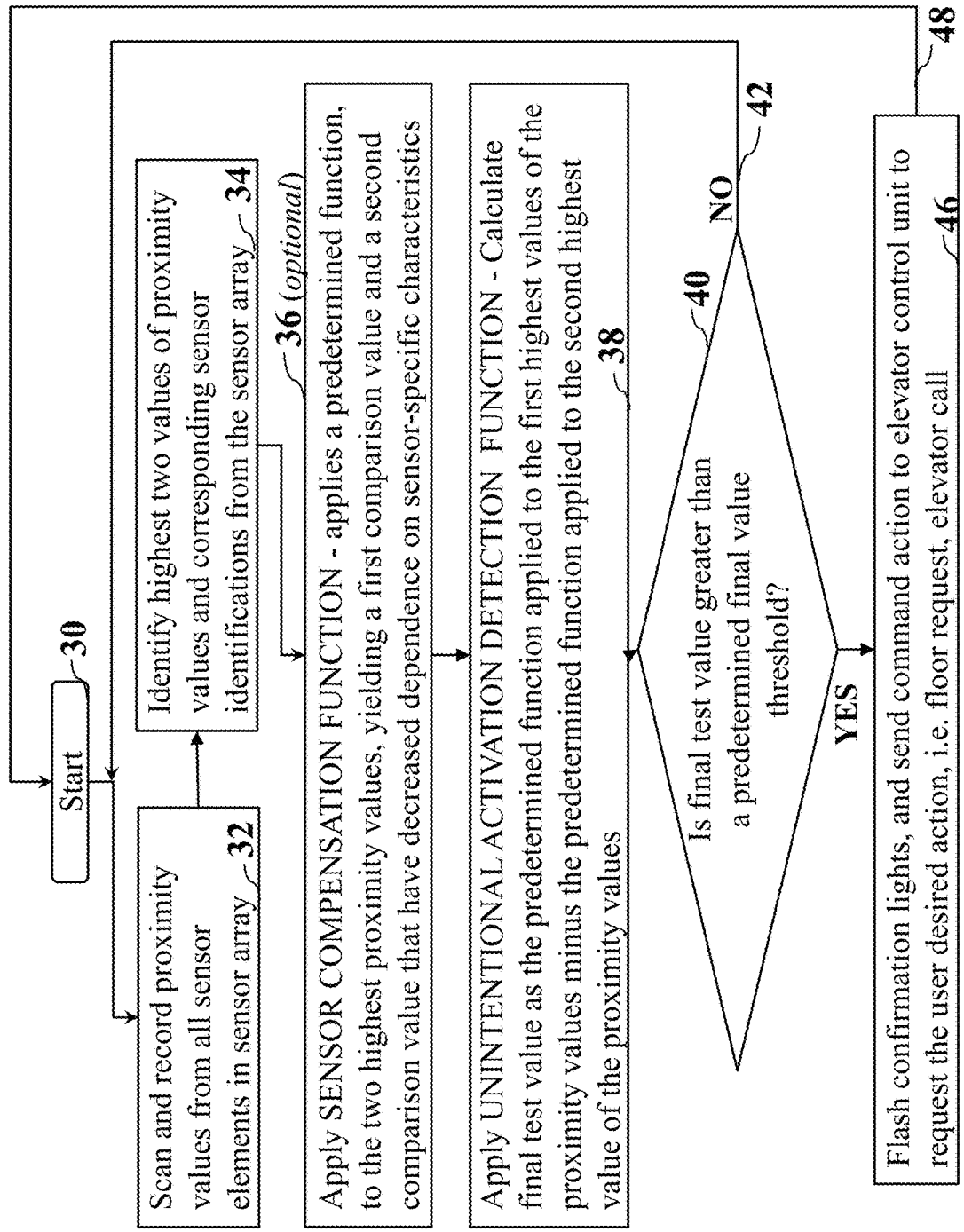
FIG. 1D is a block diagram illustrating a set of some central processing unit (CPU) steps of the touchless COP and touchless HOP embodiments of FIG. 1A and FIG. 1C for implementing contactless elevator service operation of an elevator, according to some embodiments of the present disclosure.

FIG. 1D is a block diagram illustrating a set of some central processing unit (CPU) steps of the touchless COP touchless COP and touchless HOP embodiments of FIG. 1A and FIG. 1C for implementing contactless elevator service operation of an elevator, according to some embodiments of the present disclosure.

For example, the CPU for the touchless COP 2 of FIG. 1A and touchless HOP 3 of FIG. 1C can start 30 according to the first and second embodiments of the present disclosure, and then a step 32 can include scanning and recording proximity values from all sensor elements in the sensor array.

Another embodiment (not shown) can include the labeling of the sensor elements as digit numbers in a keypad, for example, 0 to 9, plus a basement sensor element, a rear door sensor element. Such that, the CPU can be configured to change the CPU behavior from immediately transmitting a sensor floor destination request by a user base on the user activating the corresponding sensor element, and instead change the CPU behavior to include a delay time before transmitting the sensor floor destination request by the user, in order to allow for a second digit floor requests, i.e., such as a building have many floors from an $11^{th}$ through to a $99^{th}$ floor, or for as a building have many floors having a third digit floor such as 100 floors to 999 floors. Because of the large number of floors, the CPU system may include extra time, i.e. a delay time, in order to process user destination floor requests from the $11^{th}$ floor to $99^{th}$ floor or $100^{th}$ floor to the $999^{th}$ floor. Wherein, the CPU can be further configured to include a configuration switch to enable the delay time characteristic for multiple digit entry, and/or other types of configurations according a user/operator specific needs for operation.

A next CPU step 34 can include identifying from recorded proximity values from all sensor elements the highest two values of proximity values and corresponding sensors identifying sensor numbers. For example, each sensor array element number recorded proximity value is compared with the remaining recorded proximity values of the sensor array element numbers, to obtain the two highest values of recorded proximity values and their corresponding sensor array element numbers.

A next CPU step 36 can optionally be included in the CPU steps, such that CPU step 36 first subjects both the two identified highest sensor proximity values to a numeric function, such as a sensor compensation function, i.e. logistic function, before the subtraction of step 38, and the thresholding of step 40. Preferably this sensor compensation function is a monotonic increasing function can minimize the effects of per sample sensitivity differences between sensors of a same production batch, or the like, i.e. which can be referenced as an interference.

Wherein, at least one process of the numeric function of step 36 can include a process that provides for, a more suitable unintentional activation rejection effect, which may accomplish with a process that is called a "logistic function", defined by:

$$\text{logistic}(SV, SR, k) = 1/(1 + e^{(-k*(SV-SR))})$$

where sensor value SV is an actual identified highest sensor proximity value of the two sensor values, sensor range SR is a value typically chosen to be between one quarter and one half of the maximum sensor response range, and k is a steepness measure, typically chosen to be between 0.2 to 3.0. In this case, the final post-subtraction threshold is usually 0.25 to 0.5 irrespective of the actual sensor value range because the actual sensor range is compensated for by the sensor range parameter of the logistic function. Such that, each sensor value, i.e. sensor proximity value for each of the two identified highest proximity values, are applied/processed using the "logistic function". At least one reason this approach may be considered is due to the sensor specific characteristics that can include sensor variance, anomalies, or errors, due to manufacture or for other aspects.

Still referring to CPU step 36, wherein the sensor compensation function of step 38 can also be the identity function $f(x)=x$ of step 36, and thus, step 38 can be rendered moot.

A next CPU step 38 can include applying an unintentional activation detection function, that calculates a final test value, as did the numeric function of step 36, i.e. the numeric function of step 36 was applied to: (the first highest values of the proximity values) minus (the predetermined function as applied to the second highest value of the proximity values).

A next CPU step 40 is a decision step that compares the final test value determined in step 38 with a predetermined final test value threshold stored in a memory of the CPU. Wherein, if the final test value is less than or equal to the stored final test value threshold, than the CPU goes to step 32. However, if the final test value is greater than the stored final test value threshold, than the CPU goes to step 46.

CPU step 46 can include flashing a confirmation lamp(s) which are visible via lamp ports 15A, 15B, along with sending at least one command action to an elevator group control (EGC) unit to request the user desired action, i.e. floor request, elevator call, etc.).

Figure 1E:
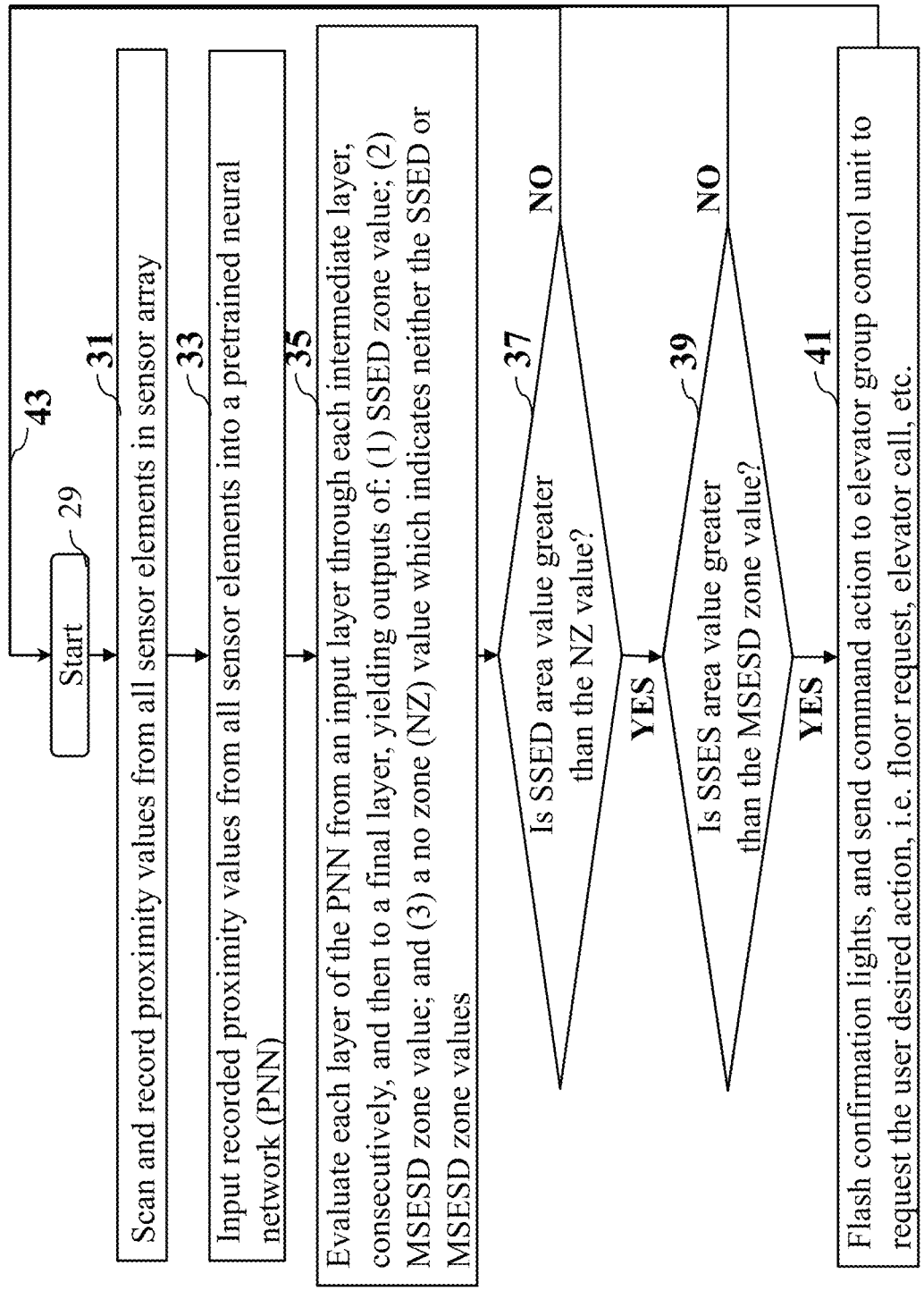
FIG. 1E is a block diagram illustrating another set of some central processing unit (CPU) steps of the touchless COP and touchless HOP embodiments of FIG. 1A and FIG. 1C for implementing contactless elevator service operation of an elevator, according to some embodiments of the present disclosure.

FIG. 1E is a block diagram illustrating another set of some central processing unit (CPU) steps of the touchless COP and touchless HOP embodiments of FIG. 1A and FIG. 1C for implementing contactless elevator service operation of an elevator, according to some embodiments of the present disclosure.

Figure 2:
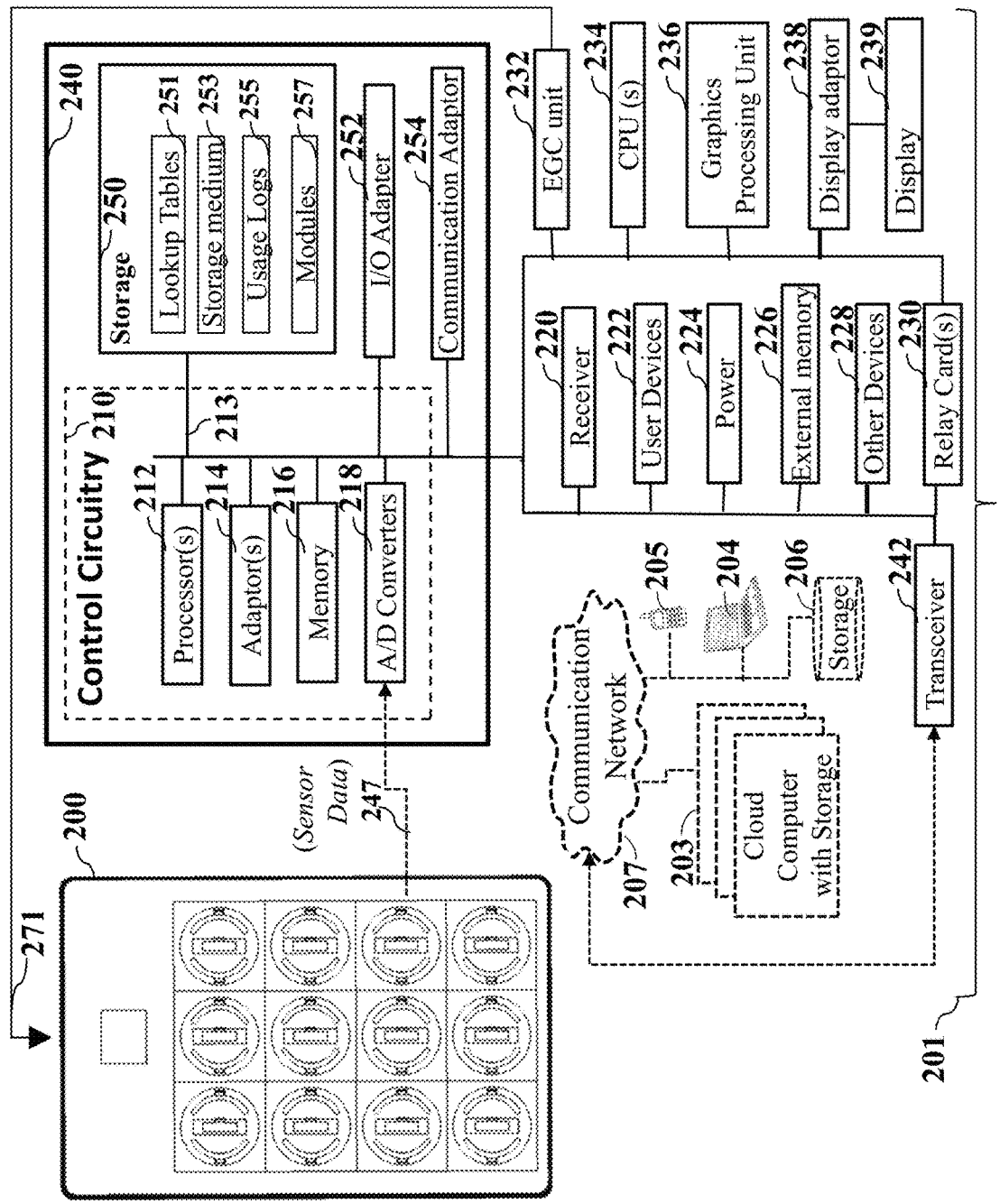
FIG. 2 is a schematic illustrating some operational components for a processing system to operate all the embodiments of the touchless COP and touchless HOP embodiments, according to some embodiments of the present disclosure.

FIG. 2 is a schematic illustrating some operational components for a processing system to operate all the embodiments of the touchless COP, according to some embodiments of the present disclosure. The processing system 201 can include control circuitry 210 having one or more processors 212, adaptors 214, memory 216 and A/D converters 218 connected via bus system 213. The memory 216 can be configured to store executable instructions. The executable instructions may be stored or organized in any manner and at any level of abstraction, such as in connection with one or more applications, processes, routines, procedures, methods, functions, etc. The instructions stored in the memory 216 and may be executed by one or more processors, such as a processor 212. A storage 250 can include an operating system (not shown) stored in the storage medium 253. Further, lookup tables 251, usage logs 255 of the touchless COP and modules can be stored in the storage 250.

Connected to the bus system 213 can include one or more I/O adaptors 252 and one or more communication adaptors 254. Further, one or more elevator group controller(s) 232 and one or more central processing units (CPU), wherein each CPU may include a reduced instruction set computer (RISC) microprocessor (not shown). Each CPU can be coupled to the system memory (RAM) 216 or storage 250 and/or various other components via a system bus 33. Read only memory (ROM) (not show) can be part of the storage 250 which can be coupled to the bus system 213 that is connected to the input/output (I/O) adaptor 252, which can control certain basic functions of processing system 201.

Still referring to FIG. 2, the bus system connects other components including a receiver 220, other user devices 222, i.e. user mouse, keyboard and display, one or more power supplies, external memory 226 and other devices 228. The other devices are provided to address user's specific goals and operating requirements. Further, the other devices 228 can include peripheral output devices connected to buses 213 via a peripheral interface. Examples of a peripheral interface can include, a serial port, a USB connection, a FIREWIRE connection, a parallel connection, and any combinations thereof.

Other components include one or more relay cards 230, graphics processor unit 236, display adaptor 238 and a display 239. For example, the relay card(s) 230 can provide dry contacts to simulate button pressing as read by the elevator group controller (EGC) 232. Further a transceiver 242 can be in communication with a communication network 207 that can be connected to one or more cloud computers 203 that can include storage 203. The Display adapter 238 and display device 239 may be utilized in combination with the processor(s) 212 to provide graphical representations of aspects of the present disclosure. In addition to the display device 239, an alternate computer system (not shown) may include one or more other peripheral output devices (not shown) including, an audio speaker, a printer, and any combinations thereof. Other components connected with the communication network 207 can include a storage unit 206, one or more laptop computers 204 as well as one or more mobile devices 205.

Still referring to FIG. 2, the buses 213 can be connected to other devices 228, which can include I/O device(s)), keyboards or keypads, touchscreens or touch panels, display screens, microphones, speaker, a mouse, a button, a remote control, a joystick, a printer, a telephone, mobile device (e.g., a smartphone), a sensor, an alternate computer system, etc. Such that, if required the above other devices can also include an adaptor of the adaptors 252. The memory 216 can store data from one or more sensors, such as a two-dimensional (2D) or three-dimensional (3D) sensor. The data can be processed by the processor 212 to control one or more parameters associated with operating the touchless COP 200 via wire 271 or wireless. The data may include data indicative of an environment in a location the elevator is operating and captured by one or more sensors, including temperature, humidity, noise data that may be included in the environment in the location of the elevator.

Other components disclosed in the present disclosure can be connected to the touchless COP as well as connected to other elevator components of an elevator (not shown) which may depend upon a user specific operational goals and requirements. Contemplated is that one or more servers (not shown) can be configured to communicate with the processing system 201 via the communication network 207. Some examples of the one or more servers (not shown) may include, one or more application servers, one or more cloud servers, one or more web servers, one or more database servers, one or more file servers, one or more mainframe servers.

Still referring to FIG. 2, the processing system 201 can be connected to components not shown such as an image sensor, a user display guide camera and a user mobile device. Alternatively, or optionally, the processing system 201 can include feedback devices (not shown) to provide an affirmative indication to a user that the user request has been recognized other than the confirmation lamps. The feedback devices may include audio or visual equipment. In some embodiments, the feedback may simply indicate that a gesture has been recognized. In some embodiments, the feedback may indicate a type of action that the processing system 201 recognized. Contemplated is that the processing system 201 may further include components not shown such as video display adapter for communicating a displayable image to a display device. Examples of a display device can include, a liquid crystal display (LCD), a cathode ray tube (CRT), a plasma display, a light emitting diode (LED) display, and any combinations thereof.

Figure 3A:
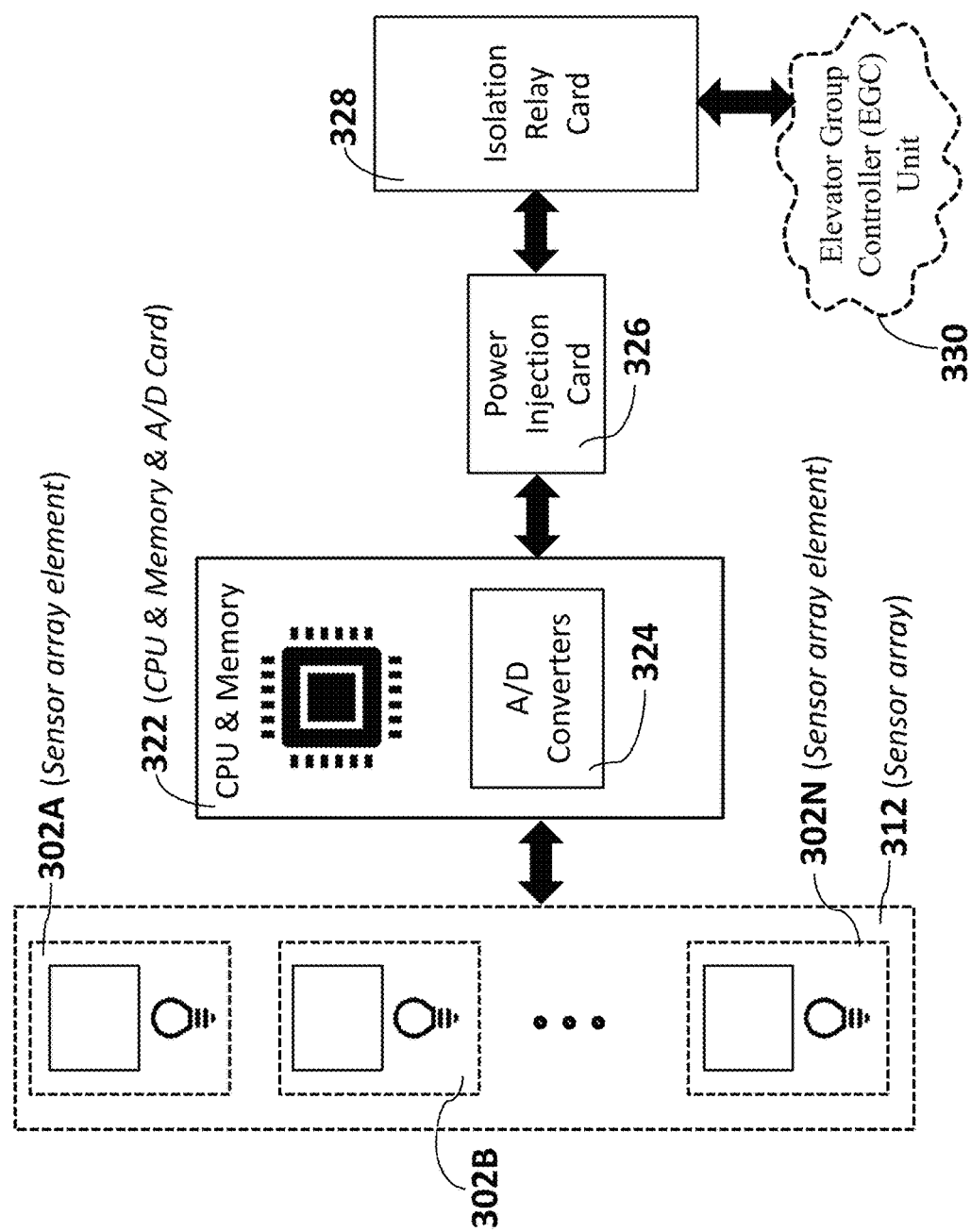
FIG. 3A is a schematic illustrating an example of a wiring diagram to operate the touchless COP embodiment of FIG. 1A and other touchless COP embodiments, according to some embodiments of the present disclosure.

FIG. 3A is a schematic illustrating an example of a wiring diagram to operate the touchless COP embodiment of FIG. 1A and other touchless COP embodiments, according to some embodiments of the present disclosure. For example, the sensor array 312 includes individual sensor array elements 302A, 302B, 302N, wherein each single sensor array element includes a confirmation lamp, such a LED or other light source, which is used to illuminate the single sensor array element.

The sensor array 312 can be connected to the CPU, memory and A/D card 322, wherein the CPU card can include A/D converters 324. The A/D converters 324 can be connected to each sensor array element 302A, 302B, 302N of the sensor array 312. The CPU card 322 can be also connected to a power injection card 326 that can provide power filtering, centralized on/off switching, power safety fusing, etc. The power injection card 326 can be connected to one or more isolation relay cards 328, wherein the one or more isolation cards 328 provide an isolated dry contact as a simulated human input, i.e. button presses, that are interpreted by an elevator group controller (EGC) unit as floor dispatch requests.

Still referring to FIG. 3A, contemplated is that there can be one or more CPU cards 322, one or more isolation relay cards 328, that can be shared, wherein any one of the one or more CPU cards 322 can be designed to activate any one of the one or more isolation relay cards, depending upon a user/operator specific configuration requirements.

Figure 3B:
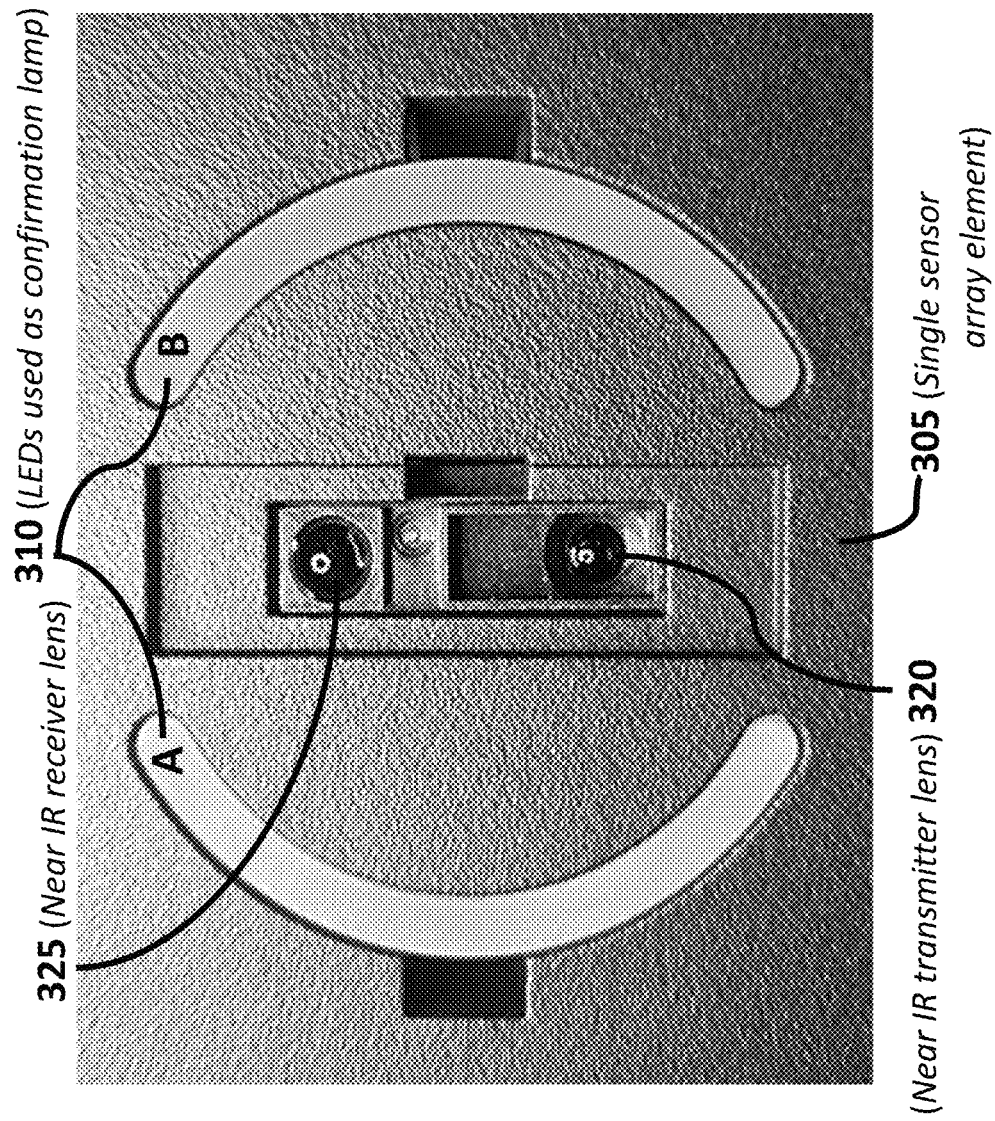
FIG. 3B is a photo illustrating an intended production of a touchless COP embodiment, according to some embodiments of the present disclosure.

FIG. 3B is a photo illustrating an intended production of a touchless COP embodiment, according to some embodiments of the present disclosure. For example, the single sensor array element 320 has a near IR receiver lens 325, a near IR transmitter 320, along with a confirmation lamp 310. Wherein the confirmation lamp can be an LED, such that the light from the LED is shown through ports A, B of 310. Other design configurations are contemplated, however, FIG. 3B provides at least one design configuration of a single sensor element.

Figure 4:
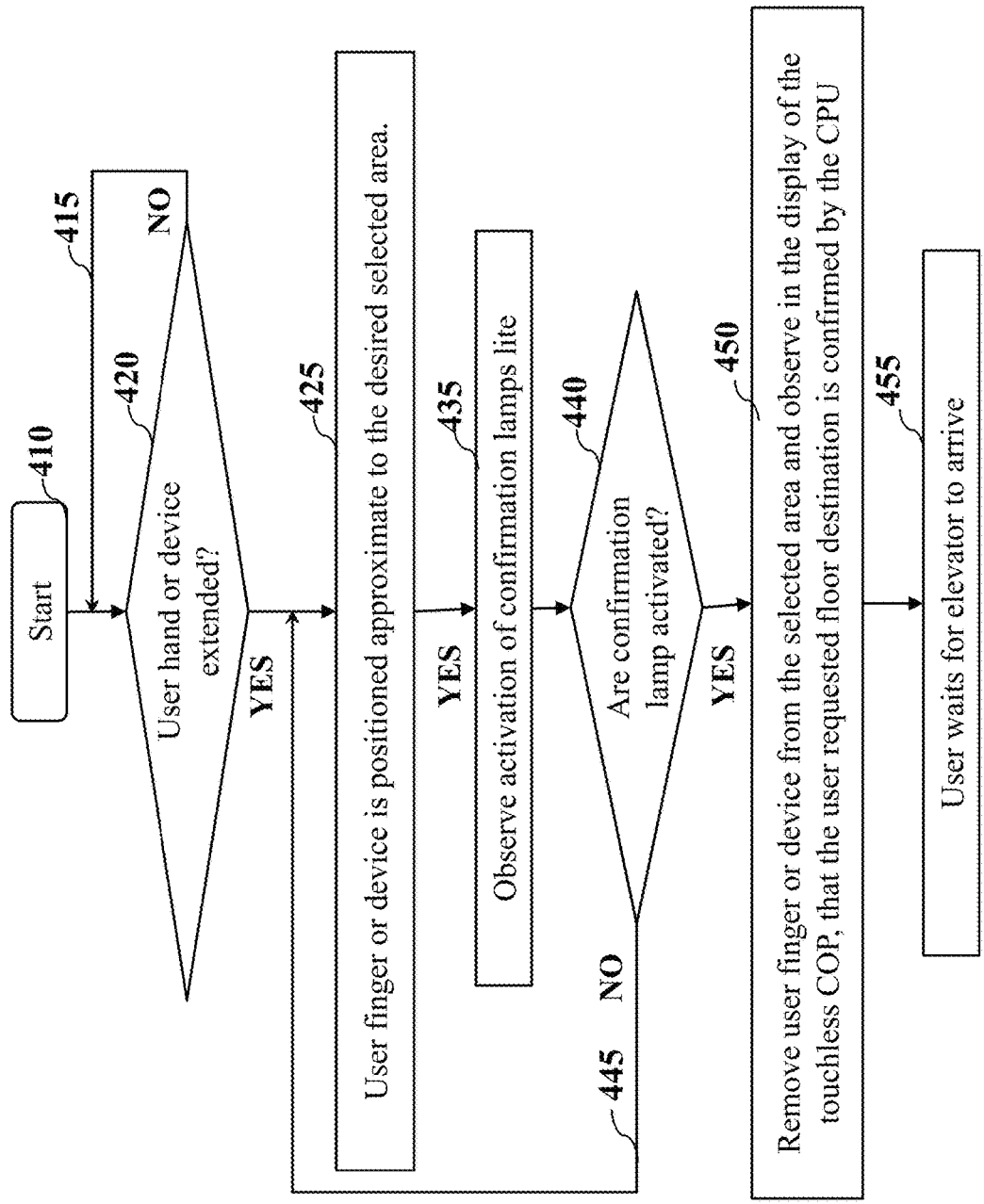
FIG. 4 is a flow diagram illustrating some decision steps by a user (person wanting to use elevator services) or a human to utilize or implement contactless elevator service operation of an elevator, according to some embodiments of the present disclosure.

FIG. 4 is a flow diagram illustrating some decision steps by a user (person wanting to use elevator services) or a human to utilize or implement contactless elevator service operation of an elevator, according to some embodiments of the present disclosure. For example, step 410 is a start of the process, and step 420 inquires if the user has extended their hand or a device, i.e. pencil, and the like, toward the user's desired selected area representative of a floor button, i.e. sensor array element, on the touchless COP. Step 415 indicates that if the user has not extended their hand or device, to do so, wherein if the user has extended their hand or device, then got to step 425.

Step 425 of FIG. 4 is the user has positioned their finger or device approximate to the desired selected area corresponding to the floor button on the touchless COP. Step 435 is the user observing activation of the confirmation lamps lighting up.

Step 440 requests the user to confirm if the confirmation lamps are activated, if yes, the user goes to step 450. Wherein the user observes the activation of the specific sensor element associated with the user intended request for the destination floor via the confirmation lamps being lighted (activated). However, if the user confirms the confirmation lamps are not activated, then the user goes to step 445 (no), and the user restarts at step 425.

Step 450 can include the user removing their finger or device from the selected area, and then can observe in the display of the touchless COP, the that user's requested floor destination is confirmed by the CPU. Finally, step 455 is that the user waiting for the elevator to arrive.

Figure 5A:
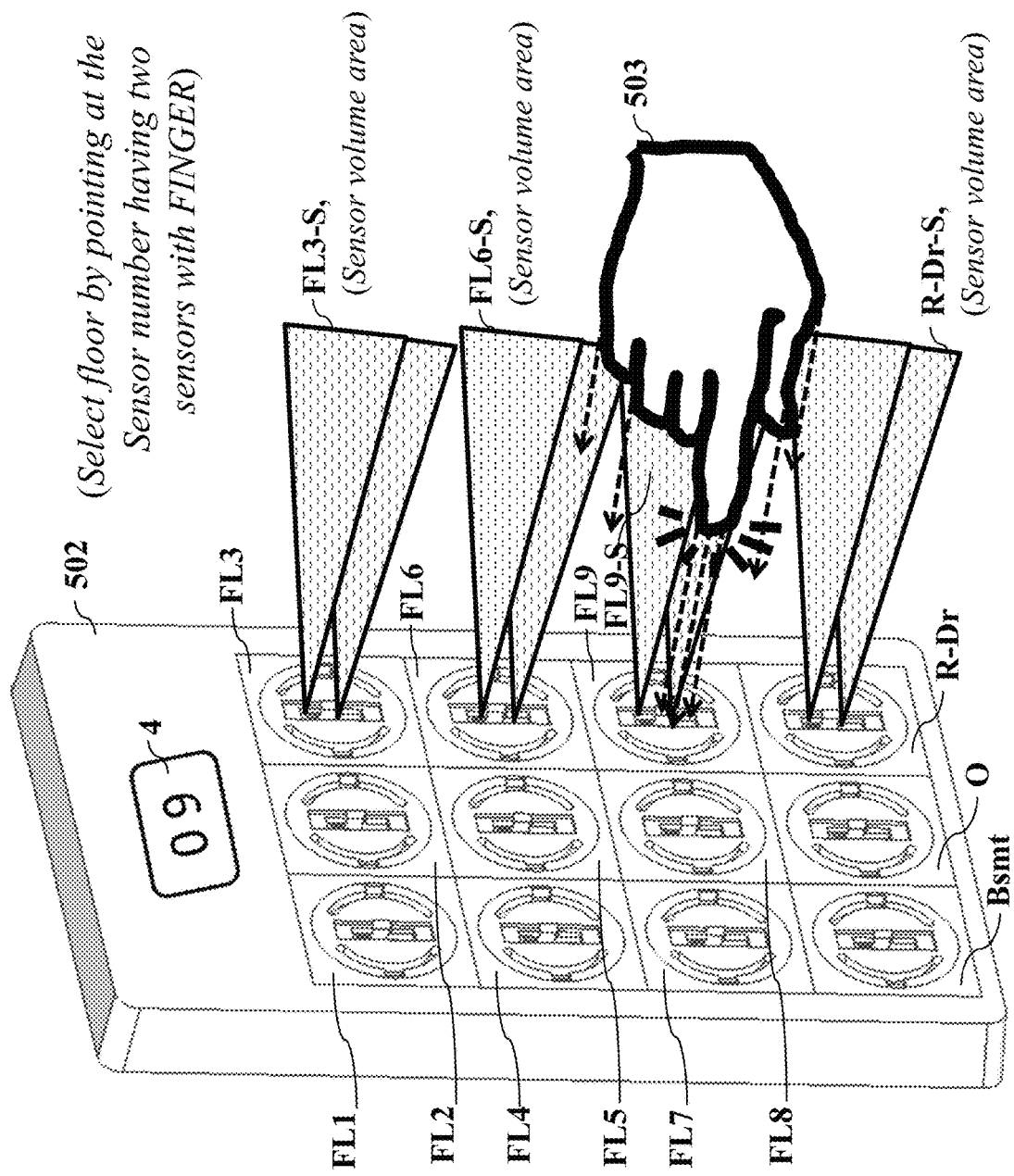
FIG. 5A is a schematic diagram illustrating a second touchless COP embodiment that includes a configuration for contactless elevator service operation of an elevator with two near IR proximity sensors, according to some embodiments of the present disclosure.

FIG. 5A is a schematic diagram illustrating a second touchless COP embodiment that includes a configuration for contactless elevator service operation of an elevator with two near IR proximity sensors, according to some embodiments of the present disclosure. Wherein some differences of the second touchless COP over that of the first touchless COP of FIG. 1A, can include, by non-limiting example, a more robust application sensing a pointing finger of a user or an object held by the user. For example, each sensor element is equipped with dual near IR proximity sensors, rather than only a single near IR proximity sensor of FIG. 1A. Thus, in order for the activation of a single element, the user's finger or object needs to be positioned within both near IR proximity sensor detection zones, otherwise the sensor element will not be activated. Some potential benefits may include less unintentional activations by the user, among many benefits.

Figure 5B:
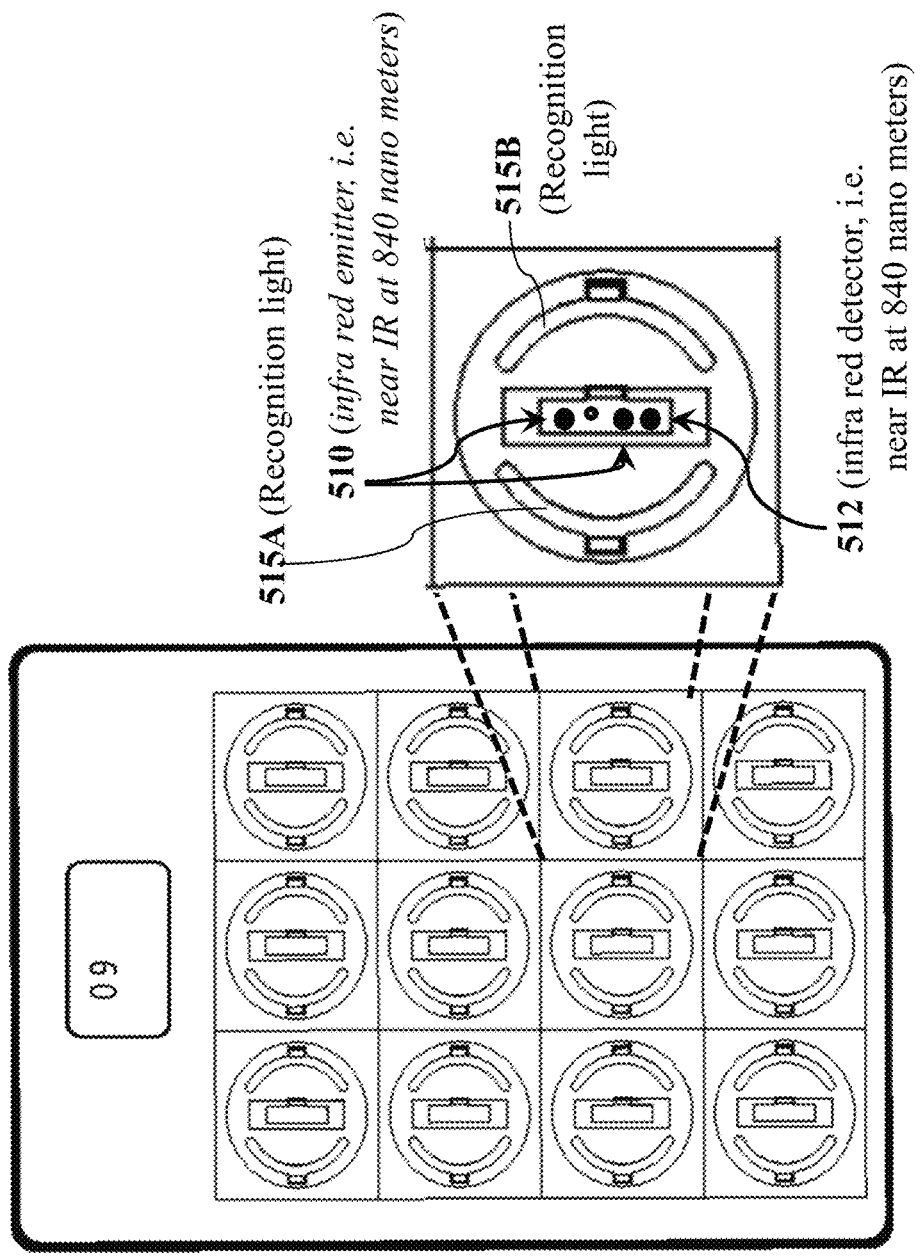
FIG. 5B is a schematic illustrating further detail of locations of the two near IR proximity sensors and some other components of the touchless COP embodiment of FIG. 5A, according to some embodiments of the present disclosure.
Figure 5C:
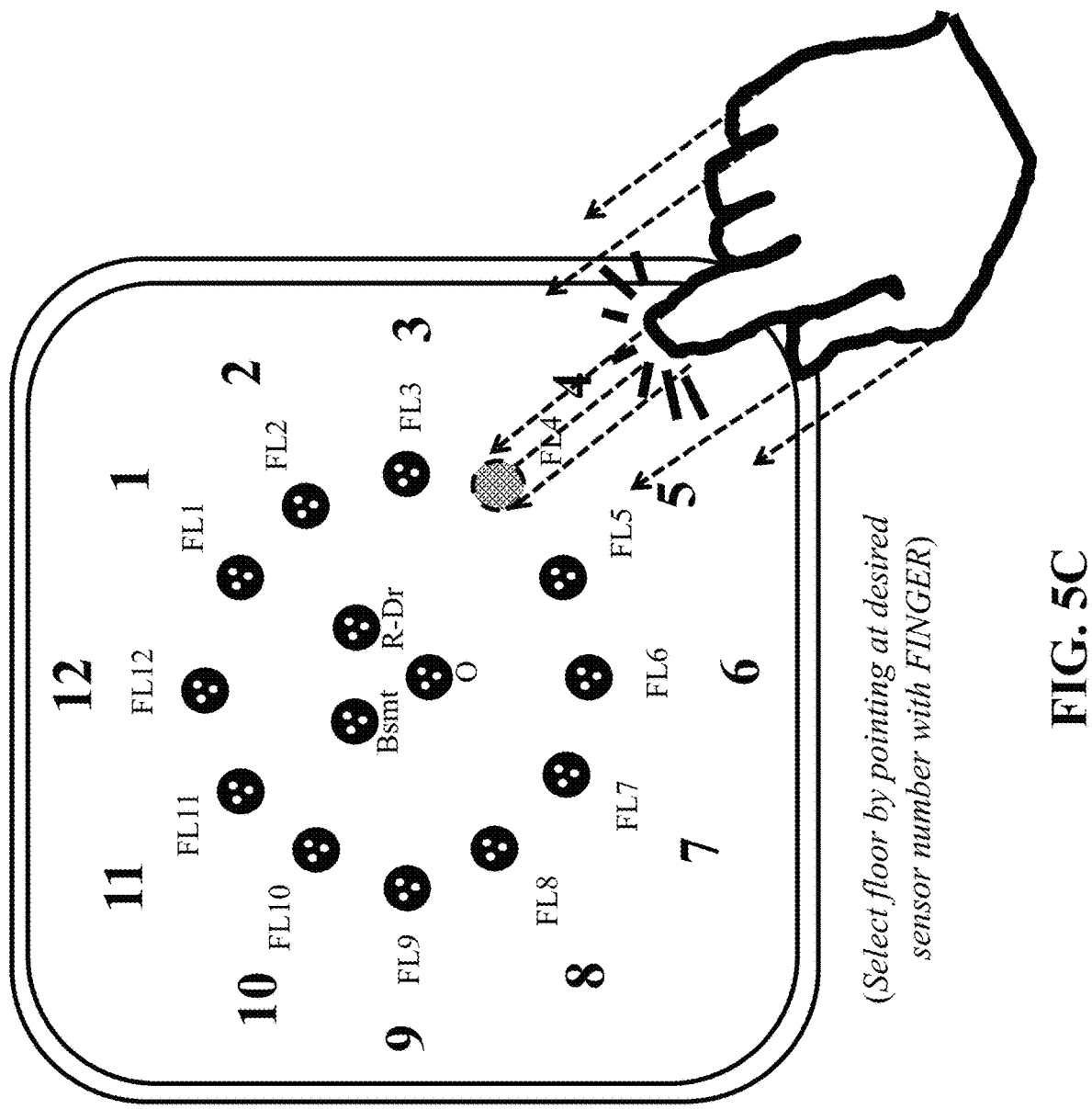
FIG. 5C is a schematic illustrating an alternate touchless COP embodiment for contactless elevator service operation of an elevator with two near IR proximity sensors, according to some embodiments of the present disclosure.

FIG. 5B is a schematic illustrating further detail of locations of the two near IR proximity sensors and some other components of the touchless COP embodiment of FIG. 5C, according to some embodiments of the present disclosure. For example, the first and second near IR proximity sensors 510 can be positioned in each sensor element vertically.

FIG. 5C is a schematic illustrating an alternate touchless COP embodiment for contactless elevator service operation of an elevator with two near IR proximity sensors, according to some embodiments of the present disclosure. For example, the design of the touchless COP can be many different shapes, as illustrated the touchless COP has a shape similar to a clock. However, many other design configuration are contemplated, which all depends upon a user specific design goals and requirement in order to meet the user's specific requirements. Noted, is that the angle at which the user approaches the single sensor element may lead to less unintentional activations.

Figure 5D:
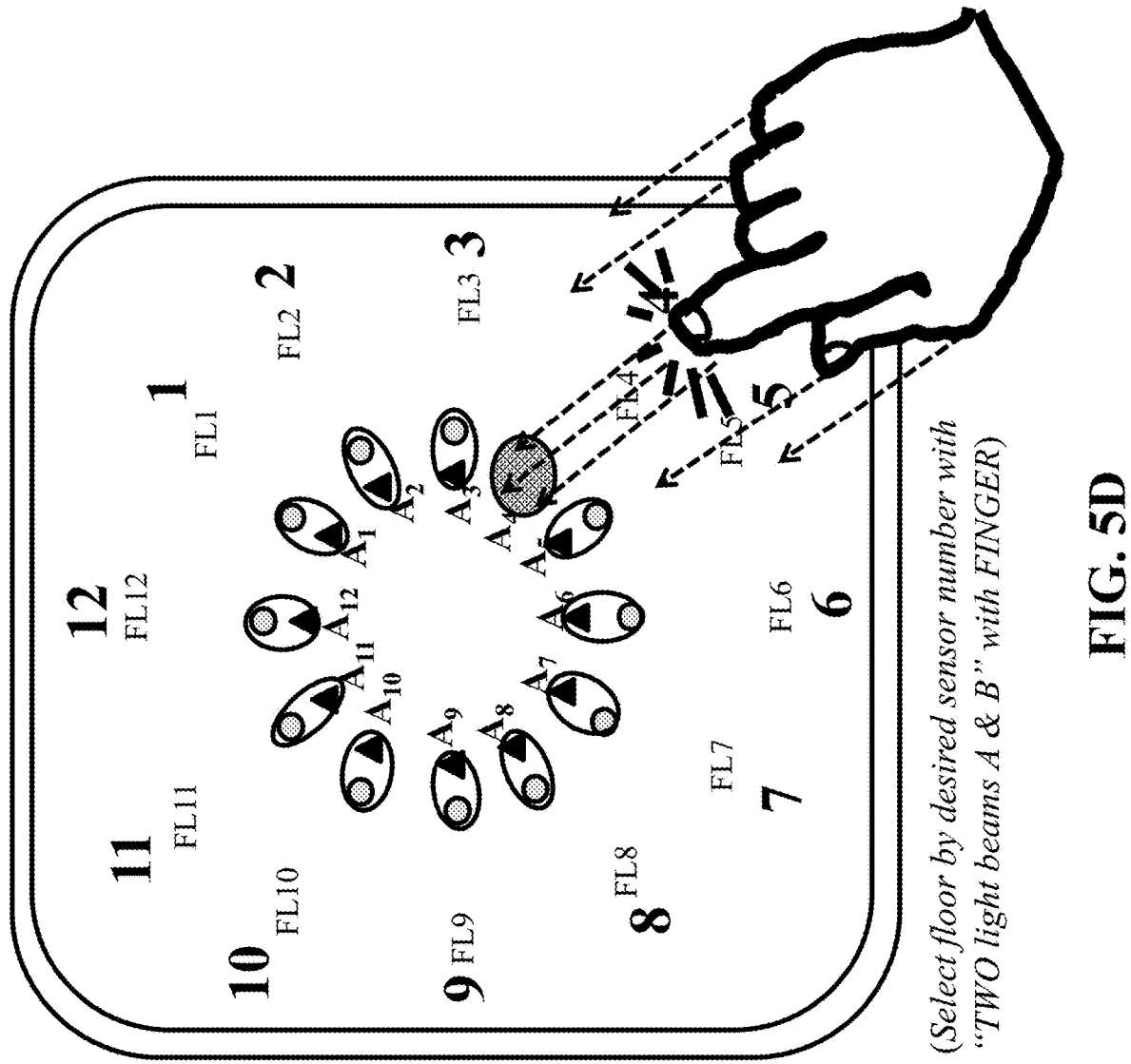
FIG. 5D is a schematic illustrating a more detailed view of the two near IR proximity sensors and some other components of the touchless COP embodiment of FIG. 5C, according to some embodiments of the present disclosure.

FIG. 5D is a schematic illustrating a more detailed view of the two near IR proximity sensors and some other components of the touchless COP embodiment of FIG. 5C, according to some embodiments of the present disclosure. For example, the first near IR proximity sensor denoted as a circle can be positioned at an angle to the second IR proximity sensor denoted as a triangle.

Figure 6A:
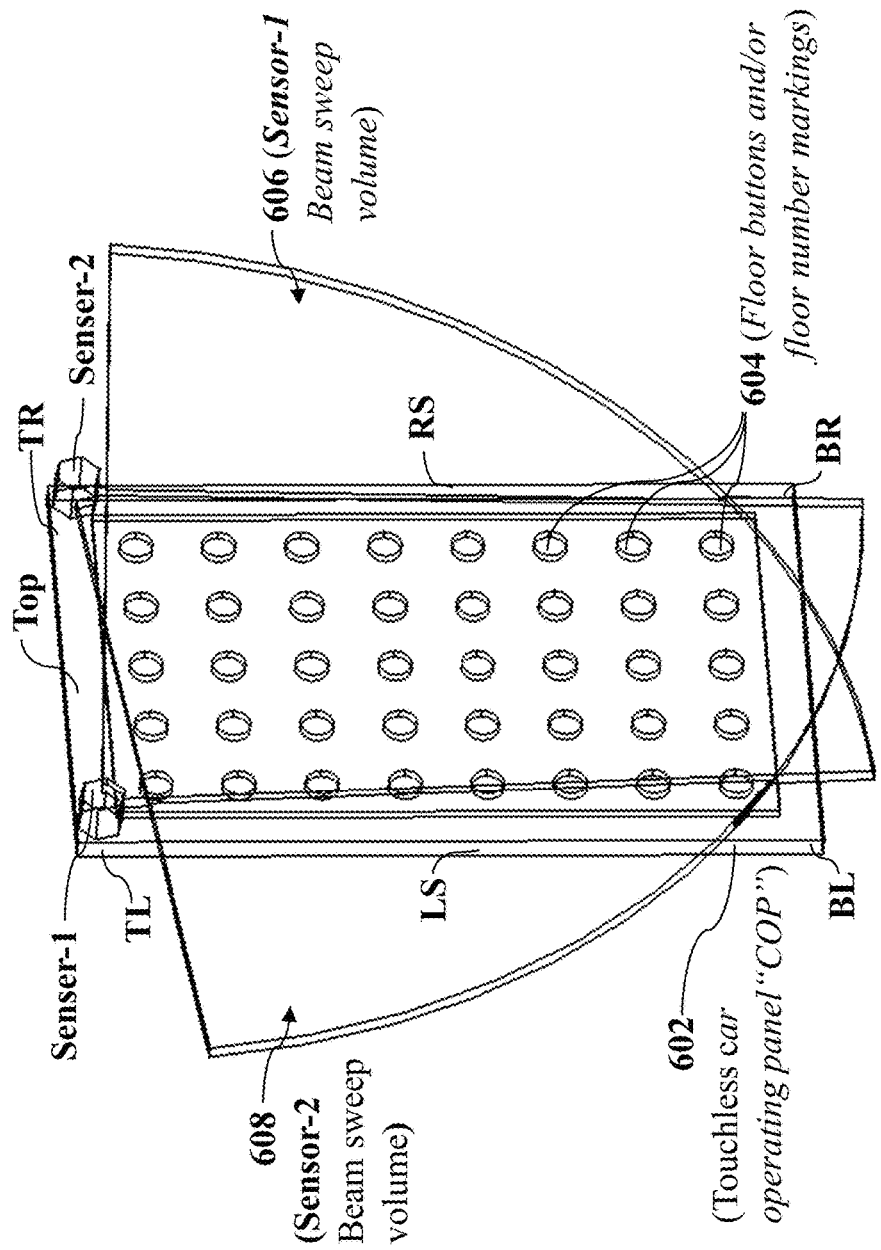
FIG. 6A is a schematic diagram illustrating a third touchless COP embodiment that includes two IR proximity angle sensors, that can include a set of CPU operational steps for using the two IR proximity angle sensors for contactless elevator service operation of an elevator, according to some embodiments of the present disclosure.

FIG. 6A is a schematic diagram illustrating a third touchless COP embodiment that includes two IR proximity angle sensors, that can include a set of CPU operational steps for using the two IR proximity angle sensors for contactless elevator service operation of an elevator, according to some embodiments of the present disclosure. For example, the two IR angle sensors Sensor-1, Sensor-2 detect an object in a sweep detection zone 606, 608 by angles. However, contemplated is that other methods can be utilized, for example, the two IR angle sensors Sensor-1, Sensor-2 can detect the object in a sweep detection zone 606, 608 by angles, distances, or both angles and distances. The specific method approach in terms of using angles, distances, or both angles and distances, will depend upon a specific sensor design and capability.

The locations of Sensor-1 and Sensor-2 are illustrated in FIG. 6A as Sensor-1 is positioned on the top left TL of the touchless COP 602 and Sensor-2 being positioned on the top right TR of the touchless COP 602. However, other locations for Sensor-1 and Sensor-2 are contemplated along on the left side LS and the right side RS, respectively, or the bottom left BL and the bottom right BR, respectively, of the touchless COP 602. The touchless COP 602 includes the sensor array with the sensor elements 604, i.e. as represented often as floor button numbers, and/or floor number markings that can be associated with a basement floor, rear door, and the like.

Still referring to FIG. 6A, an active infrared (IR) proximity angle sensors Sensor-1, Sensor-2 operate by sweeping a beam of near IR light within their respective IR proximity angle detection zones 606, 608 that bounce off object(s), i.e. a user's finger, see FIG. 1A, from different directions. An algorithm embedded in the near IR sensor processes the reflected signals and calculates angles to the objects that is detected. The IR proximity angle sensors Sensor-1, Sensor-2 will output the angles whenever requested by the CPU per scan time period, the outputted angles can be provided in different measurement formats, that are converted by the individual sensors or later converted as a processing step by the CPU, depending upon a level sophistication of the specific IR proximity angle sensor(s) being used.

Figure 6B:
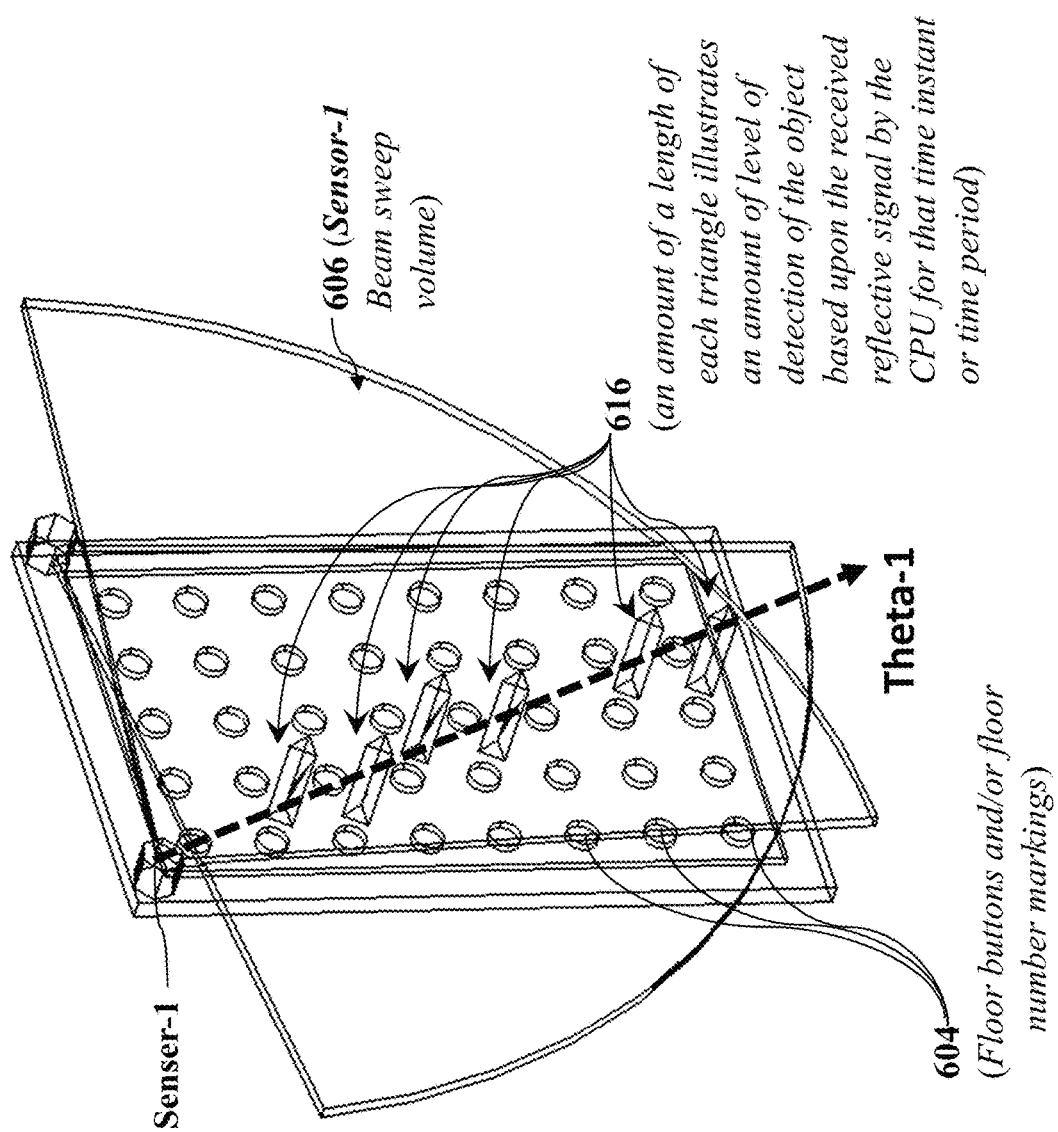
FIG. 6B is a schematic diagram illustrating the third touchless COP embodiment of FIG. 6A that includes showing a first operational step using the first IR angle sensor, such that a level of detection of an object can be displayed and illustrated as a shape such as triangles, according to some embodiments of the present disclosure.

FIG. 6B is a schematic diagram illustrating the third touchless COP embodiment of FIG. 6A that includes showing a first operational step using the first IR proximity angle sensor Sensor-1, such that a level of detection of an object can be displayed and illustrated as a shape such as triangles, according to some embodiments of the present disclosure. For example, Sensor-1 includes a sweep detection zone 606 (see FIG. 1A), wherein an angle can be obtained from an object within the sweep detection zone 606 and a reflected signal can be represented as Theta-1. Alternatively, as noted above, the Theta-1 reflected angle measurement value can be used by itself, or used with a combined the theta angle measurement value and a theta distance measurement value method, or some other theta measurement value methods depending upon the specific sensor requirements and capability.

Figure 6C:
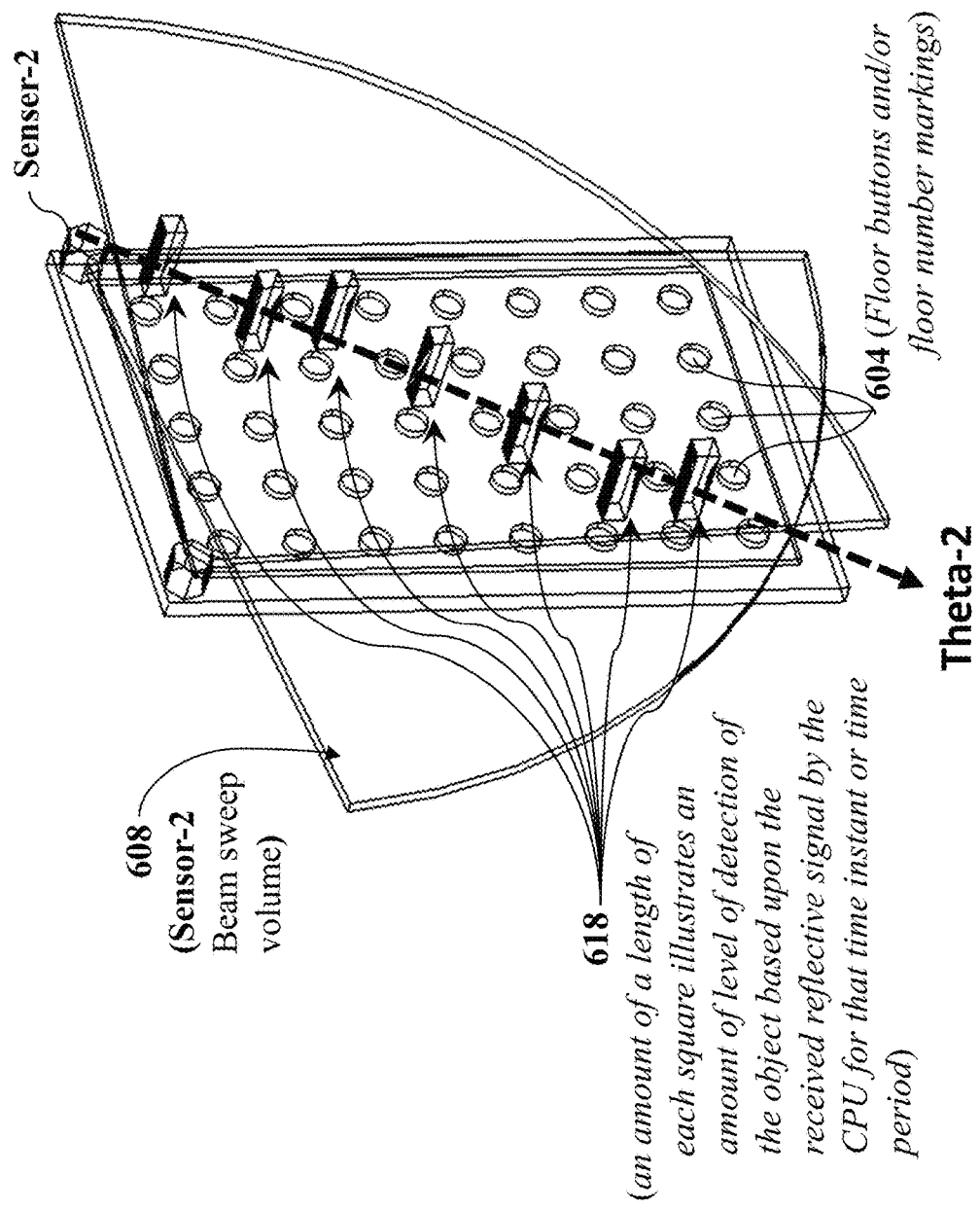
FIG. 6C is a schematic diagram illustrating the third touchless COP embodiment of FIG. 6A that includes showing a second operational step using the second IR angle sensor, such that a level of detection of an object can be displayed and illustrated as a shape such as squares, according to some embodiments of the present disclosure.

FIG. 6C is a schematic diagram illustrating the third touchless COP embodiment of FIG. 6A that includes showing a second operational step using the second IR proximity angle sensor Sensor-2, such that a level of detection of an object can be displayed and illustrated as a shape such as squares, according to some embodiments of the present disclosure. For example, the second IR proximity angle sensor Sensor-2 includes the sweep detection zone 606, wherein an angle can be obtained from an object within the sweep detection zone 606 as a reflected signal represented as Theta-2. Like FIG. 6B, an amount of detection of the object or the received reflective signal by the CPU is represented as an amount of length of each square 618 within Sensor-2 detection zone 608. Such that Sensor-2 senses an object at an angle Theta-2; where Sensor-2 does not sense any range information. Therefore, any floor buttons 604 labeled with squares could be a desired destination floor requested by a user. Wherein a length of each square indicates a level of received signal strength detected by the Sensor-2 which is compared to a predetermined received signal strength threshold stored in a Sensor-2 database, and later determined to be above the threshold.

Referring to FIG. 6B and FIG. 6C, the first and second IR proximity angle sensors Sensor-1, Sensor-2 can be activated by a CPU, such that each sensor is sensing all the time or continuously, each scan can be considered a scan time period.

For that scan time period the sensors are looking for information associated with a user requesting use of the elevator, i.e. the user placing their finger or a user's object within the respective sensor detection zone 606, 608, to request for a destination floor. The user enters the elevator car and then can use their finger or a user's object to request a destination floor number from the touchless COP located in the elevator car. Wherein upon the specific requested sensor element being activated, i.e. user's finger or user's object, within the respective detection zone bounces back or reflects as a reflective signal off the finger/object, the reflective signal can be received and acknowledge by the CPU.

For each received theta angle Theta-1, Theta-2 can be amount between a minimum to a maximum of a sensing range, such that a predetermined calculation for each theta angle Theta-1, Theta-2 is calculated to determine an associated zero or more floor button numbers for a set of Theta-1 values and a set of Theta-2 values.

For example, during a training period, predetermined calculated lookup tables are previously calculated for each theta angle Theta-1, Theta-2, so there is a stored Theta-1 lookup table and a stored Theta-2 lookup table, of which can be stored in separate databases, i.e. Theta-1 database, Theta-2 database. Wherein the received sets of Theta-1 and Theta-2 values can be compared to their respective stored lookup table to determine where possible targeted floor buttons are associated with each possible integer value of the received respective theta values, Theta-1 values, Theta-2 values, from a minimum to a maximum.

Still referring to FIG. 6B and FIG. 6C, upon triggering the sensor Sensor-1, Sensor-2 one or more theta values Theta-1 values, Theta-2 values are sent to the CPU for that scanning time period. The theta values Theta-1 values, Theta-2 values can include one or a combination of: (1) theta angles values between a minimum to a maximum of a sensing range (i.e. sensor detection zone) of the sensor Sensor-1, Sensor-2 as shown in FIG. 6B and FIG. 6C; (2) contemplates is using theta distance values from a position of the Sensor-1 to an object approximate a desired floor button and from a position of the Sensor-2 to the object approximate a desired destination floor button, based upon using distance related methods; (3) also contemplated are using some other sensed measurement values methods that can be utilized with lookup tables for Sensor-1, Sensor-2 or other Sensor-N type sensors (not shown).

Wherein in according to the illustrated example of FIG. 6B, the Sensor-1, senses an object at a theta angle value Theta-1, i.e. in this example shown in FIG. 6B, the theta value contains only angle measurement information and not distance range information from Sensor-1 location to a location of the object approximate the user desired floor button. Upon receiving the theta measurement values from Sensor-1 as Theta-1 of FIG. 6B, then theta measurement values from the Sensor-2 are obtained as Theta-2 of FIG. 6C, by the CPU. Wherein, the theta measurement values are converted to possible desired floor numbers based on comparing the theta measurement values to the Sensor-1 or Theta-1 lookup table and Sensor-2 or Theta-2 lookup table, respectively. Such that the converting of the measurement values to a possible desired floor numbers can be by a cost function or other optimizing related function depending upon an operator's specific goals and system operational requirements.

Still referring to FIG. 6B and FIG. 6C, FIG. 6B illustrates triangles from Sensor-1 indicating possible desired floor numbers requested by the user: such that without additional measurement values, it is not possible to determine which floor is requested by a user. Further, FIG. 6C illustrates squares from Sensor-2 indicating possible desired floor numbers requested by the user: such that without additional measurement values, it is not possible to determine which floor is requested by a user.

Figure 6D:
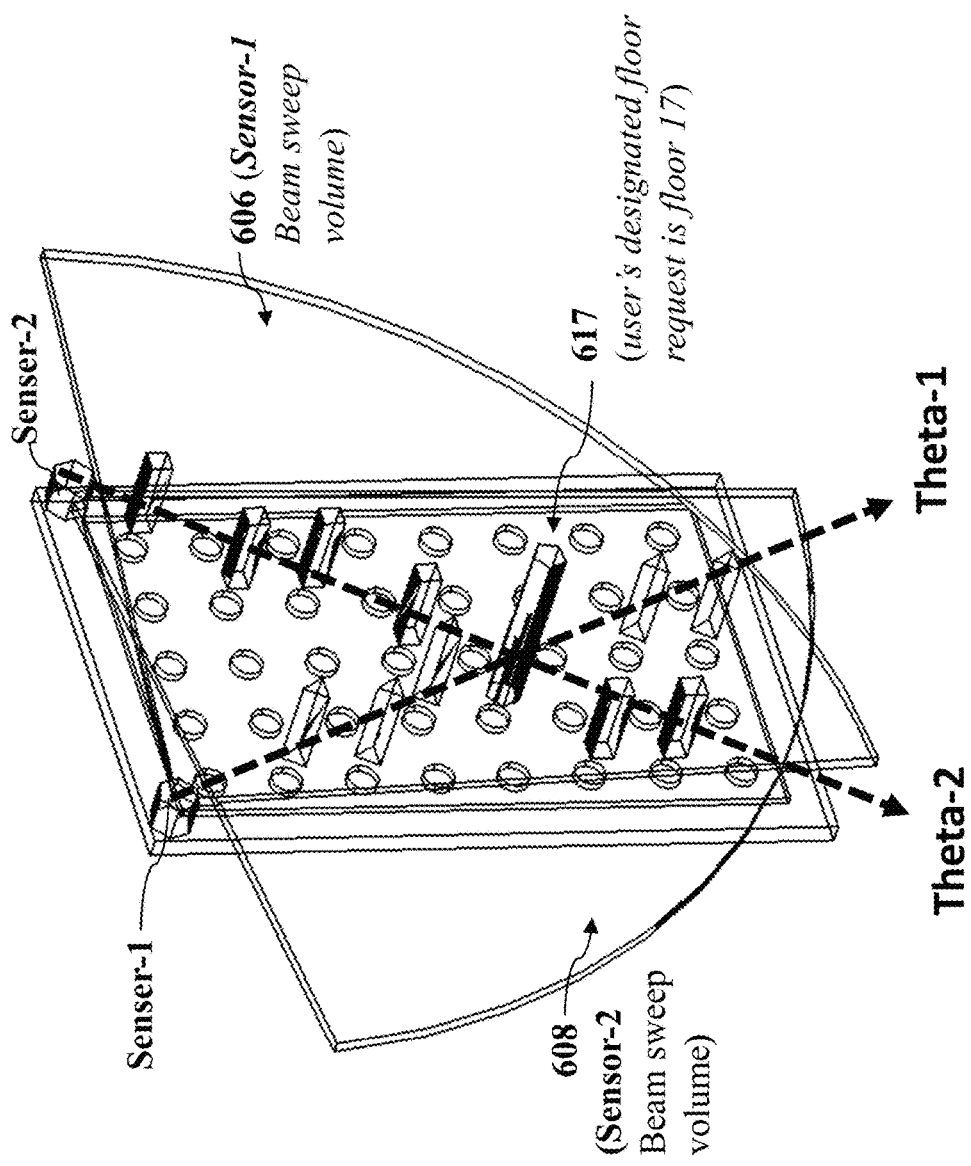
FIG. 6D is a schematic diagram illustrating the third touchless COP embodiment of FIG. 6A that includes showing the third operational step using both the first and second IR angle sensors, according to some embodiments of the present disclosure.

FIG. 6D is a schematic diagram illustrating the third touchless COP embodiment of FIG. 6A that includes showing the third operational step using both the first and second IR angle sensors, according to some embodiments of the present disclosure. For example, while the first and second IR proximity angle sensors Sensor-1, Sensor-2 are sensing, each sensor can be configured to show a received level of signal strength by the respective sensor that can be denoted by a length of each triangle (Sensor-1, Theta-1 signal) and squares (Sensor-2, Theta-2 signal), for each scanning time period. Each received level of signal strength is compared to a predetermined received signal strength threshold stored their respective designated lookup table, i.e. a Sensor-1 lookup table, and Sensor-2 lookup table. When the received level of signal strength for the respective Theta-1 of Sensor 1 and Theta-2 of Sensor-2, exceeds their respective stored predetermined received signal strength threshold, then a possible received desired floor buttons will be recognized as denoted by triangles for Theta-1 of Sensor-1 and squares for Theta-2 of Sensor-2, i.e. where a length of each triangle and each square can be shown or illustrated using a display device as represented as a level of strength of the received reflected signal, i.e. Theta-1, Theta-2.

However, in order to identify a user request for a destination floor, Sensor-1 number of signal strengths exceeding the threshold illustrated by triangles are added to Sensor-2 number of signal strengths exceeding the threshold illustrated by squares. Such that when the triangles of Sensor-1 and the squares of Sensor-2 are combined based on addition, the result shows a user request for floor 17. As noted above, any floor buttons labeled with triangles of Sensor-1 and squares of Sensor-2 could be a desired floor requested by a user.

Figure 6E:
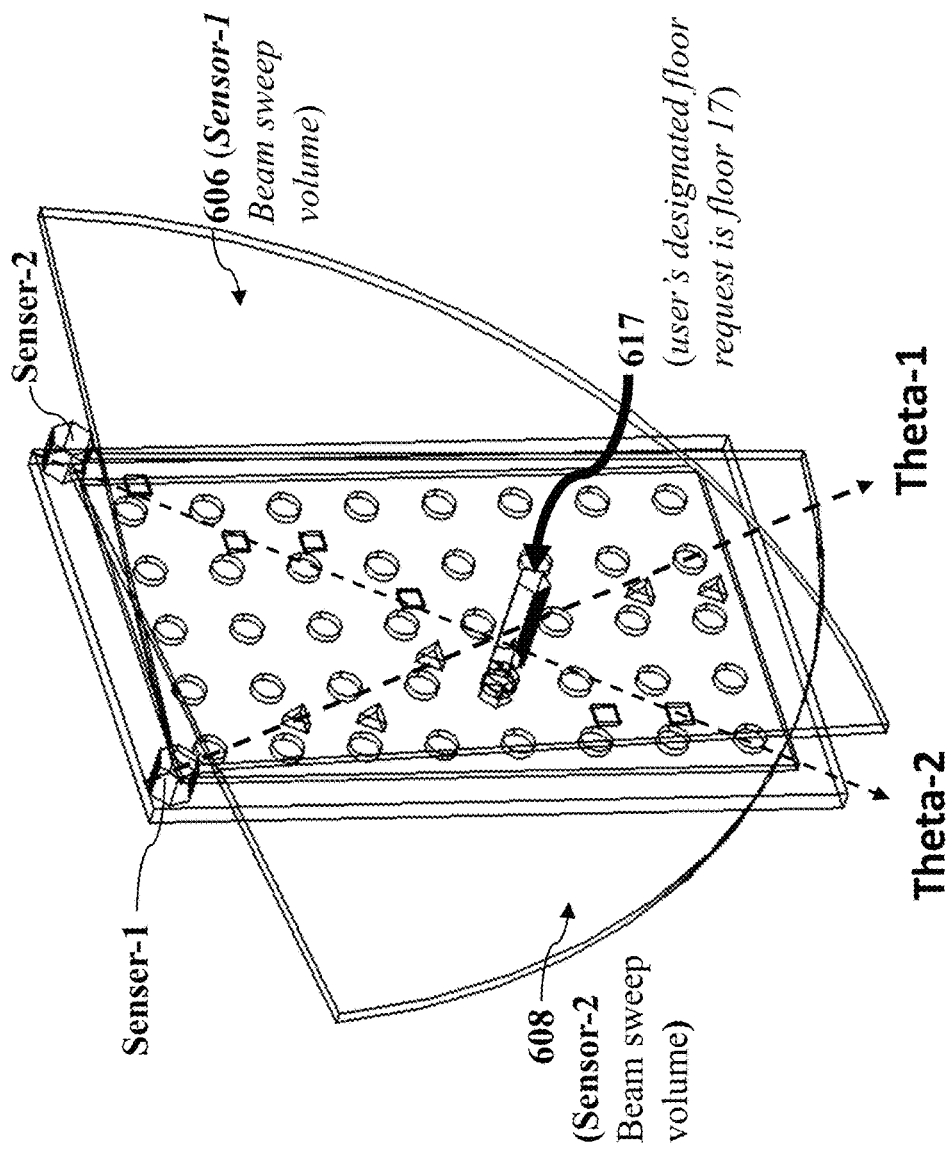
FIG. 6E is a schematic diagram illustrating the third touchless COP embodiment of FIG. 6A that includes showing a fourth operational step showing a final result selecting a single floor request for elevator service, according to some embodiments of the present disclosure.

FIG. 6E is a schematic diagram illustrating the third touchless COP embodiment of FIG. 6A that includes showing a fourth operational step of subtraction of the second highest value from the highest value, then thresholding, showing a final result after thresholding against a predetermined threshold, thereby selecting a single floor request for elevator service, according to some embodiments of the present disclosure.

Figure 7A:
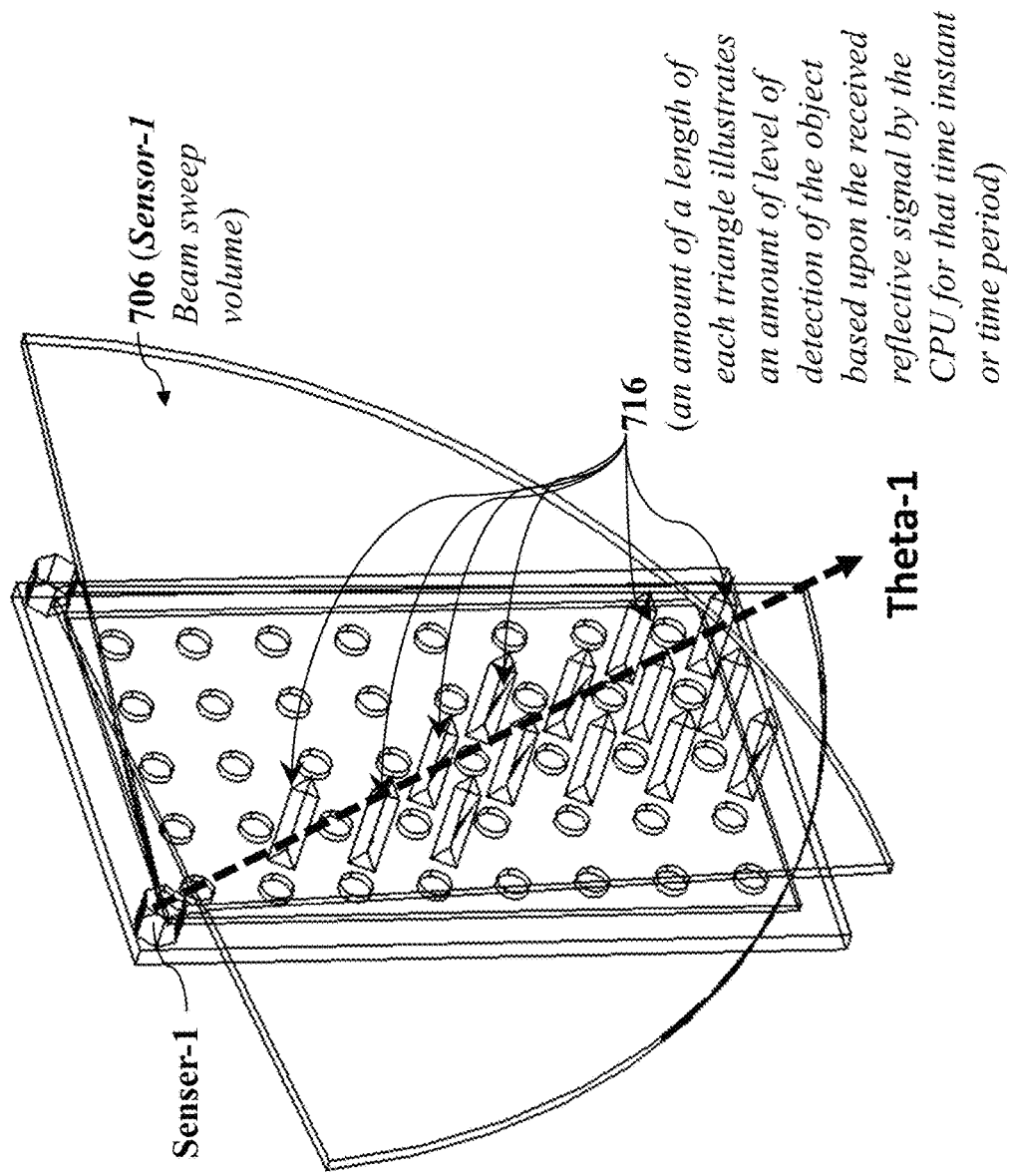
FIG. 7A is a schematic diagram illustrating the third touchless COP embodiment that includes two IR angle sensors configuration, showing an unintended user activation, for example, by a user's elbow or an object that is associated with the user or user holding the object, according to some embodiments of the present disclosure.

FIG. 7A is a schematic diagram illustrating the third touchless COP embodiment that includes two IR angle sensors configuration, showing an unintended user activation, for example, by a user's elbow or an object that is associated with the user or user holding the object, according to some embodiments of the present disclosure. Similarly as illustrated in FIG. 6B, FIG. 7A shows an amount of detection of a large object actually caused by an unintentional activation, i.e. caused by a user's elbow, by the CPU, that is represented as triangles 716 within Sensor-1 detection zone 706. Such that Sensor-1 senses the large object at multiple angles Theta-1; where Sensor-1 does not sense any range information. Therefore, any floor buttons labeled with triangles are an indication of a possible unintentional activation.

Figure 7B:
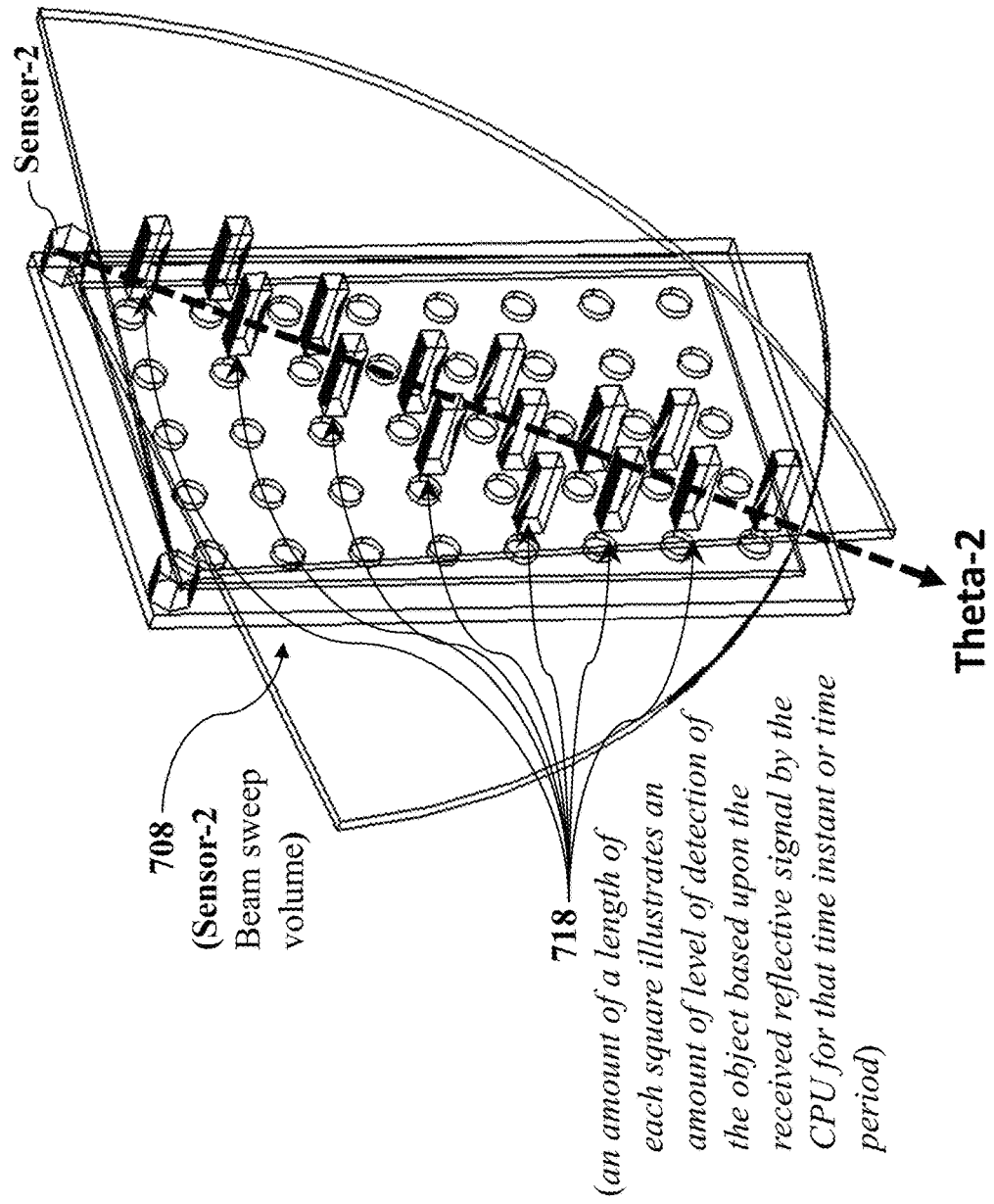
FIG. 7B is a schematic diagram illustrating the third touchless COP embodiment of FIG. 7A showing a first operational step using the first IR angle sensor during unintentional activation, according to some embodiments of the present disclosure.

FIG. 7B is a schematic diagram illustrating the third touchless COP embodiment of FIG. 7A showing a second operational step using the second IR angle sensor during unintentional activation, according to some embodiments of the present disclosure. Similarly, as illustrated in FIG. 6C, FIG. 7B shows an amount of detection of a large object actually caused by an unintentional activation, i.e. caused by a user's elbow, by the CPU, that is represented as squares 718 within Sensor-2 detection zone 708. Such that Sensor-2 senses the large object at multiple angles Theta-2; where Sensor-2 does not sense any range information. Therefore, any floor buttons labeled with squares are an indication of a possible unintentional activation.

Figure 7C:
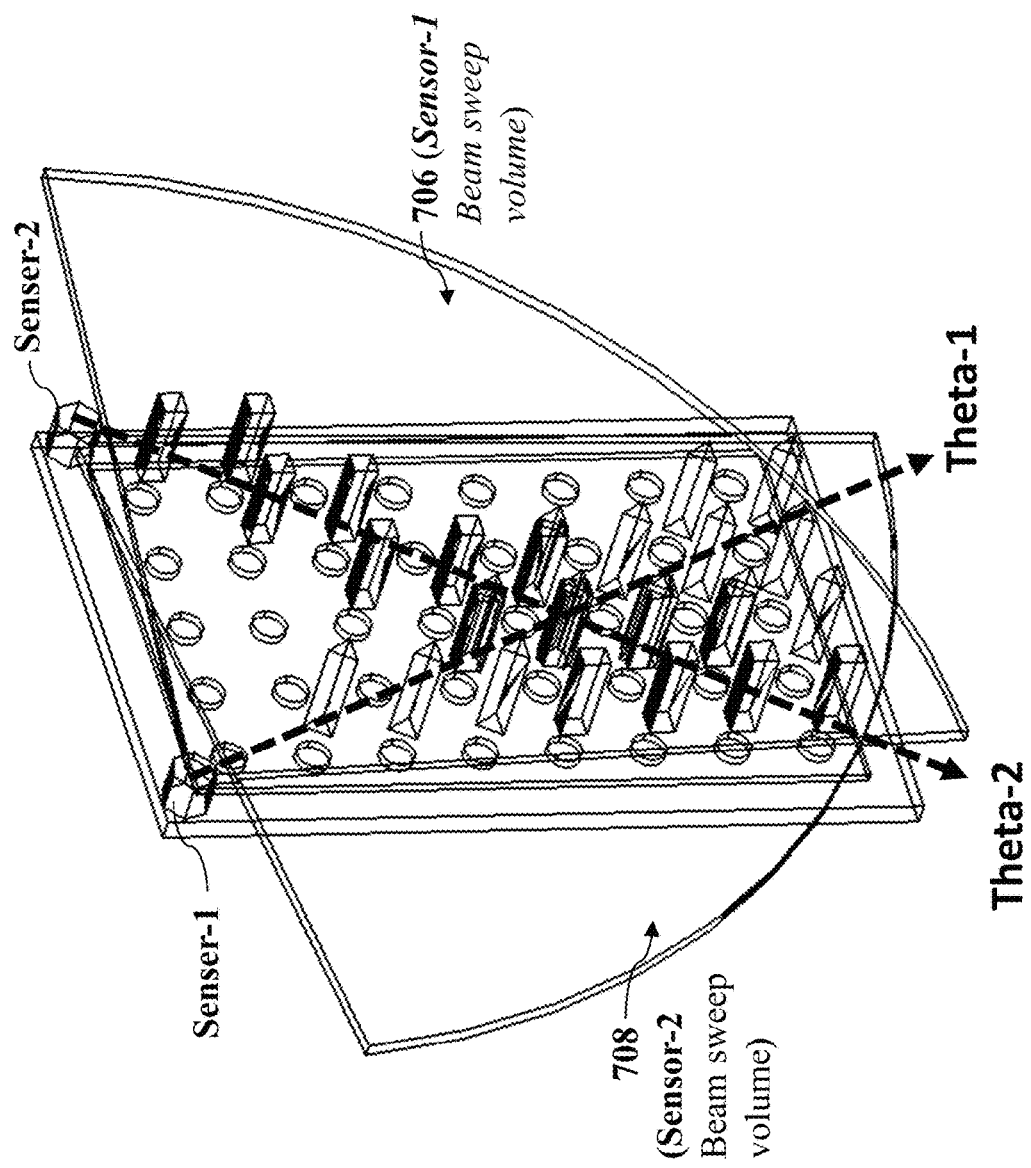
FIG. 7C is a schematic diagram illustrating the third touchless COP embodiment of FIG. 7A showing a second operational step using the second IR angle sensor during unintentional activation, according to some embodiments of the present disclosure.

FIG. 7C is a schematic diagram illustrating the third touchless COP embodiment of FIG. 7A showing a third operational step using the first and the second IR angle sensors during unintentional activation, according to some embodiments of the present disclosure. As shown in FIG. 7C, there are many activations of sensor elements which indicative of an unintentional activation, for example, by a user's elbow.

Figure 7D:
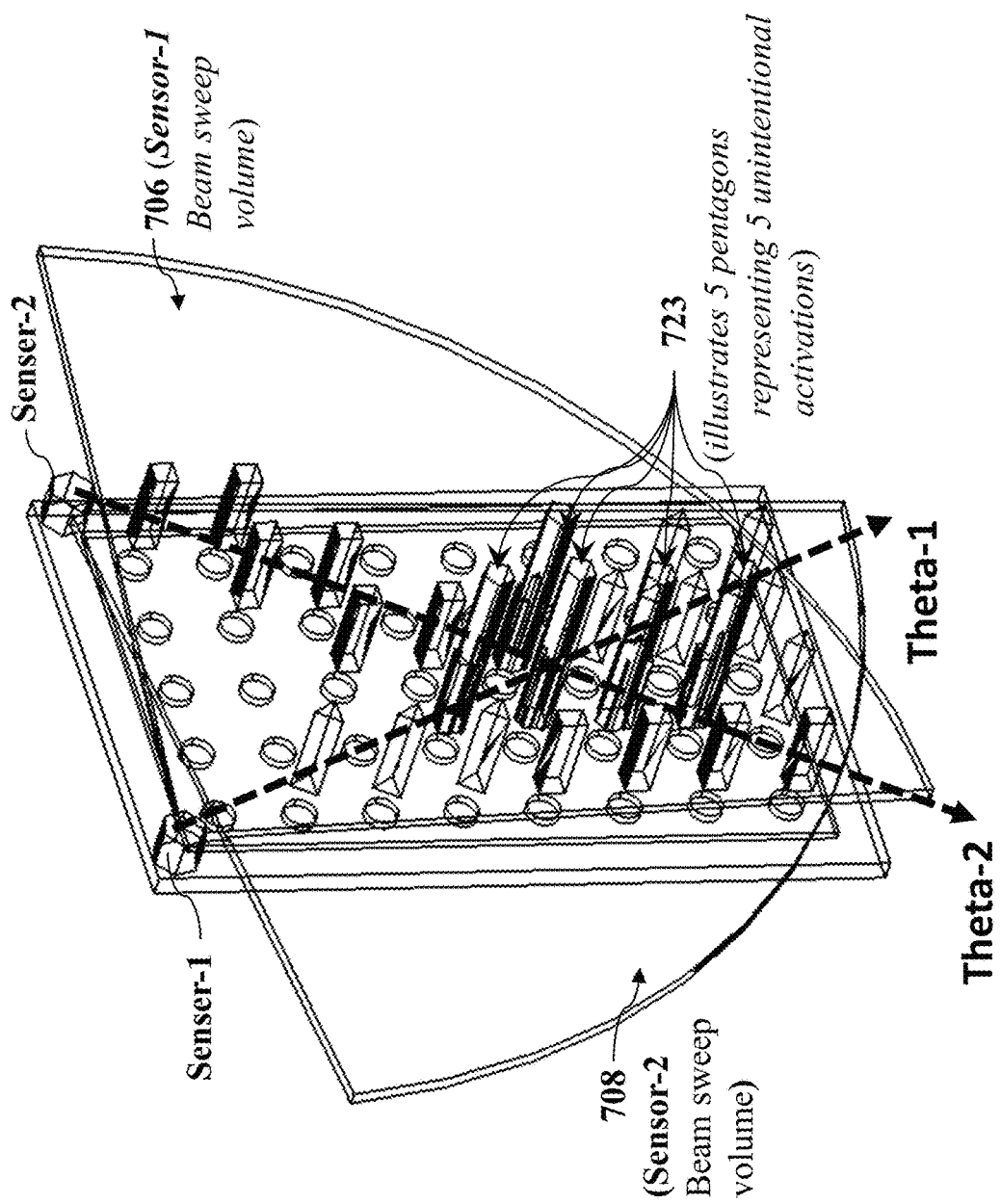
FIG. 7D is a schematic diagram illustrating the third touchless COP embodiment of FIG. 7A showing the third operational step using both the first and second IR angle sensors during unintentional activation, wherein the first and second IR angle sensors activations are combined, according to some embodiments of the present disclosure.

FIG. 7D is a schematic diagram illustrating the third touchless COP embodiment of FIG. 7A showing the fourth operational step after thresholding without subtraction that is shown using both the first and second IR angle sensors during unintentional activation, wherein the first and second IR angle sensors activations are combined, according to some embodiments of the present disclosure. Wherein FIG. 7D shows five (5) pentagons representing five (5) unintentional activations, which would cause five erroneous floor calls by the CPU, resulting a delay of elevator services along with frustrating the passengers.

Figure 7E:
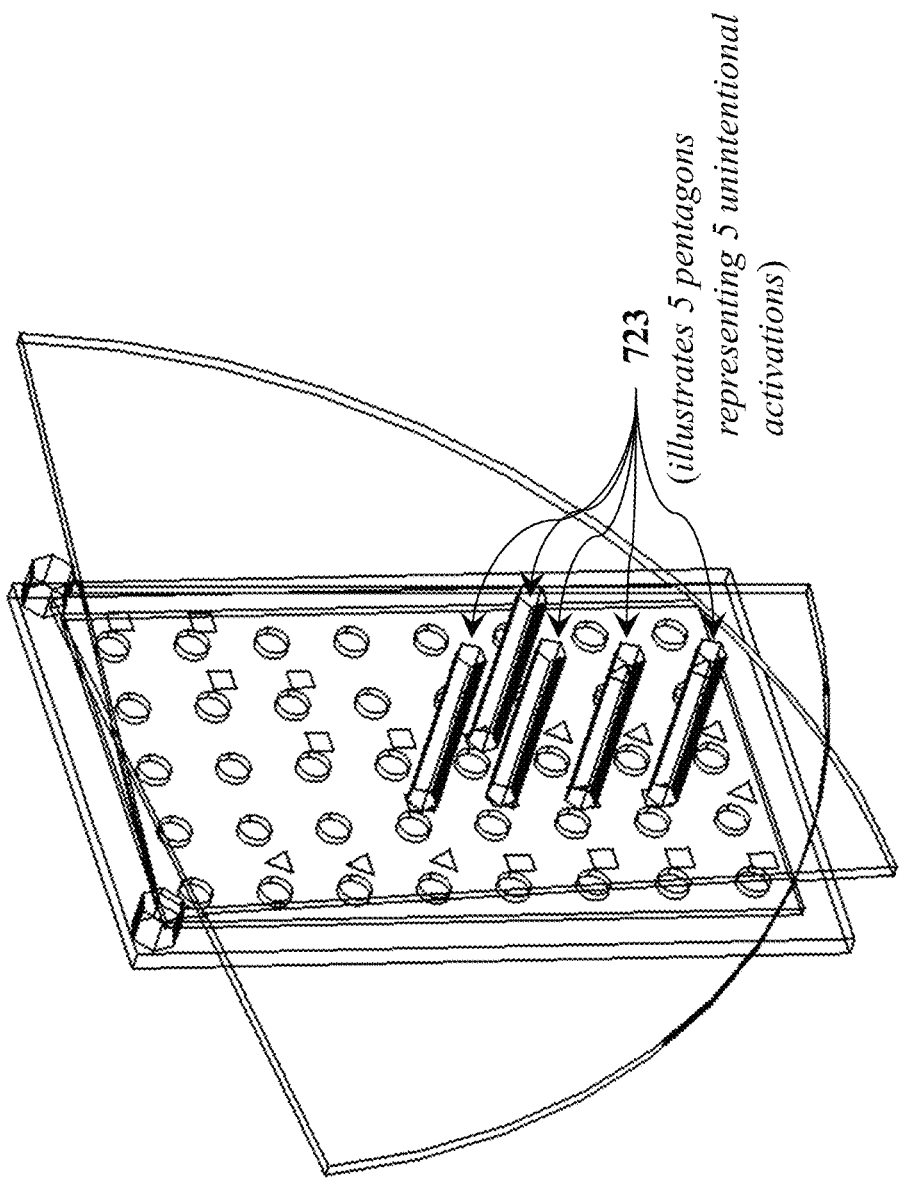
FIG. 7E is a schematic diagram illustrating the third touchless COP embodiment of FIG. 7A showing a fourth operational step showing a result of five possible floor requests for elevator service during the unintentional activation, wherein all five possible floor requests are termed incorrect, according to some embodiments of the present disclosure.

FIG. 7E is a schematic diagram illustrating the third touchless COP embodiment of FIG. 7A showing the fourth operational step after thresholding without subtraction more clearly than FIG. 7D, showing a result of the five possible floor requests 723 for elevator service during the unintentional activation, wherein all five possible floor requests are termed incorrect, according to some embodiments of the present disclosure.

Figure 7F:
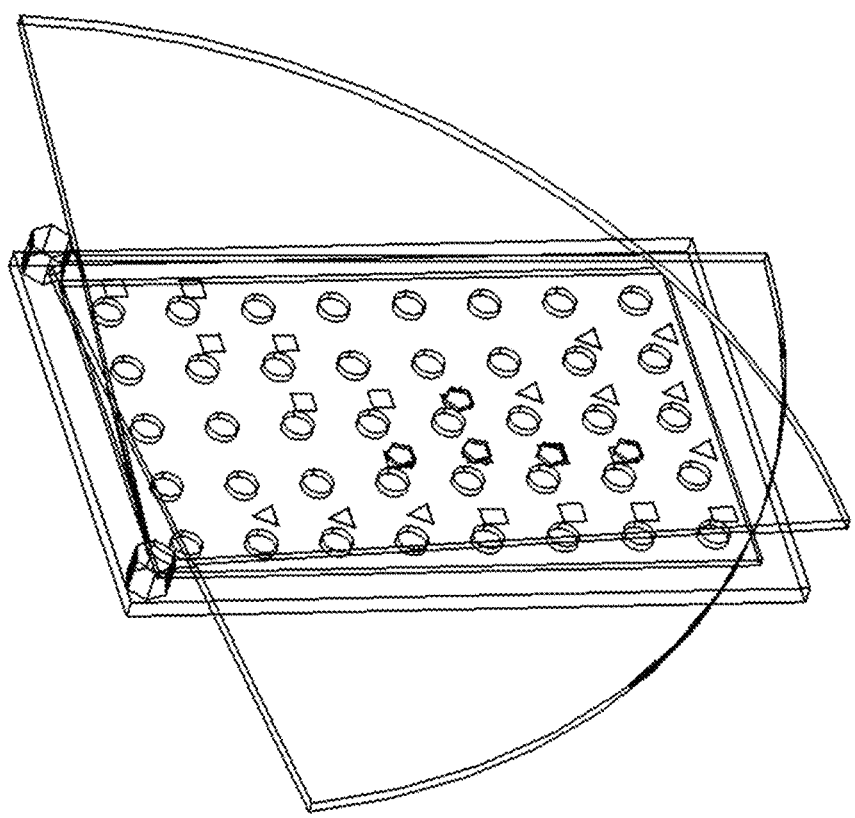
FIG. 7F is a schematic diagram illustrating the third touchless COP embodiment of FIG. 7A showing a fifth operational step showing the result of the all possible five floor activations are rejected because of the unintentional activation, and no floor service calls are registered to the elevator group controller, according to some embodiments of the present disclosure.

FIG. 7F is a schematic diagram illustrating the third touchless COP embodiment of FIG. 7A showing a fifth operational step showing the result after subtraction and thresholding, and showing all possible five floor activations are rejected because of the unintentional activation, and no floor service calls are registered to the elevator group controller, according to some embodiments of the present disclosure. As shown in FIG. 7F, the five erroneous floor activations are suppressed by the CPU.

Figure 8:
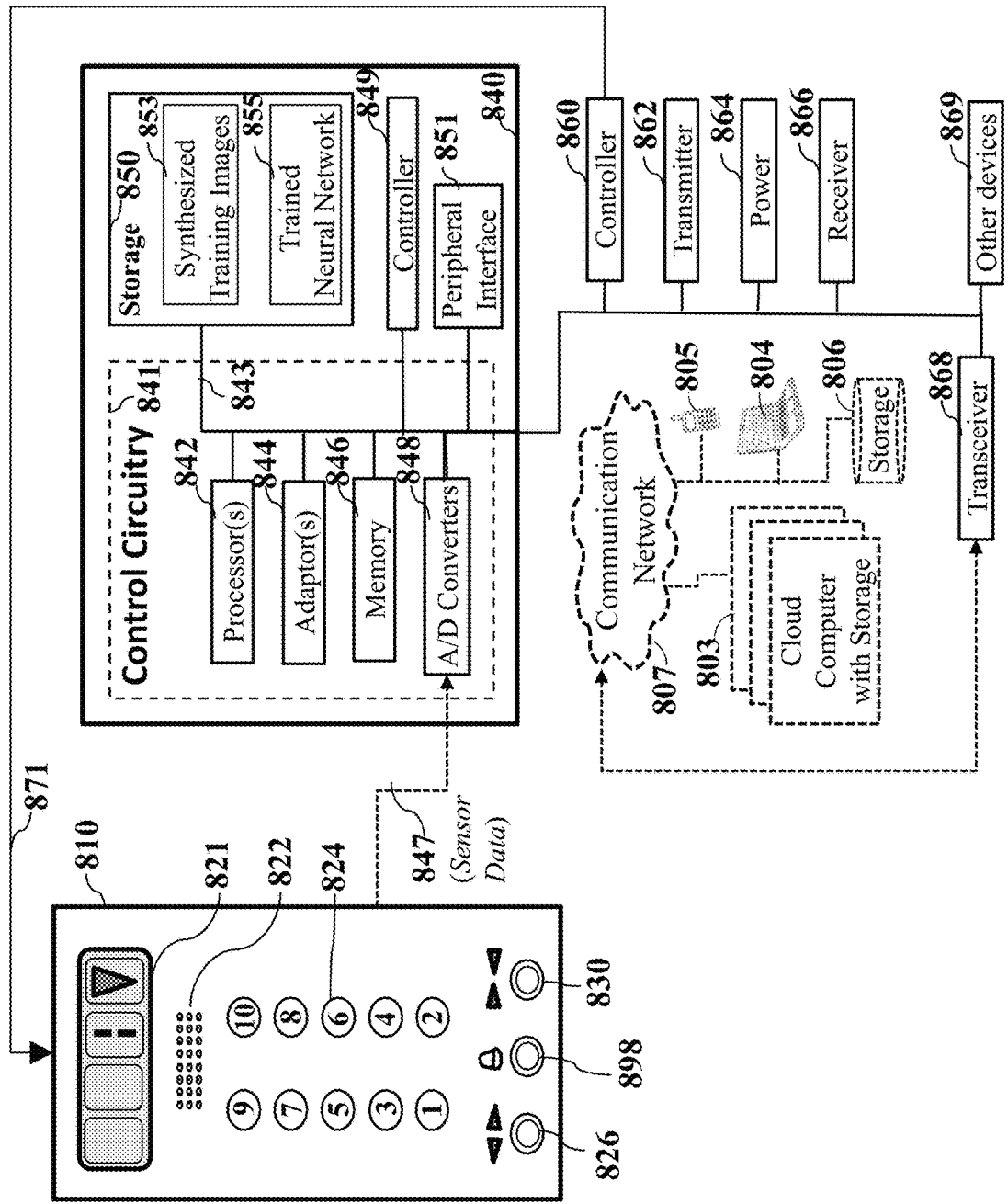
FIG. 8 is a schematic illustrating some additional operational components to operate all the embodiments of the touchless COP that can be combined with or partially combined with the components of FIG. 2, that can be based upon each individual user/operation specific design requirements, according to some embodiments of the present disclosure.

FIG. 8 is a schematic illustrating some additional operational components to operate all the embodiments of the touchless COP that can be combined with or partially combined with the components of FIG. 2, that can be based upon each individual user/operation specific design requirements, according to some embodiments of the present disclosure.

Figure 9:
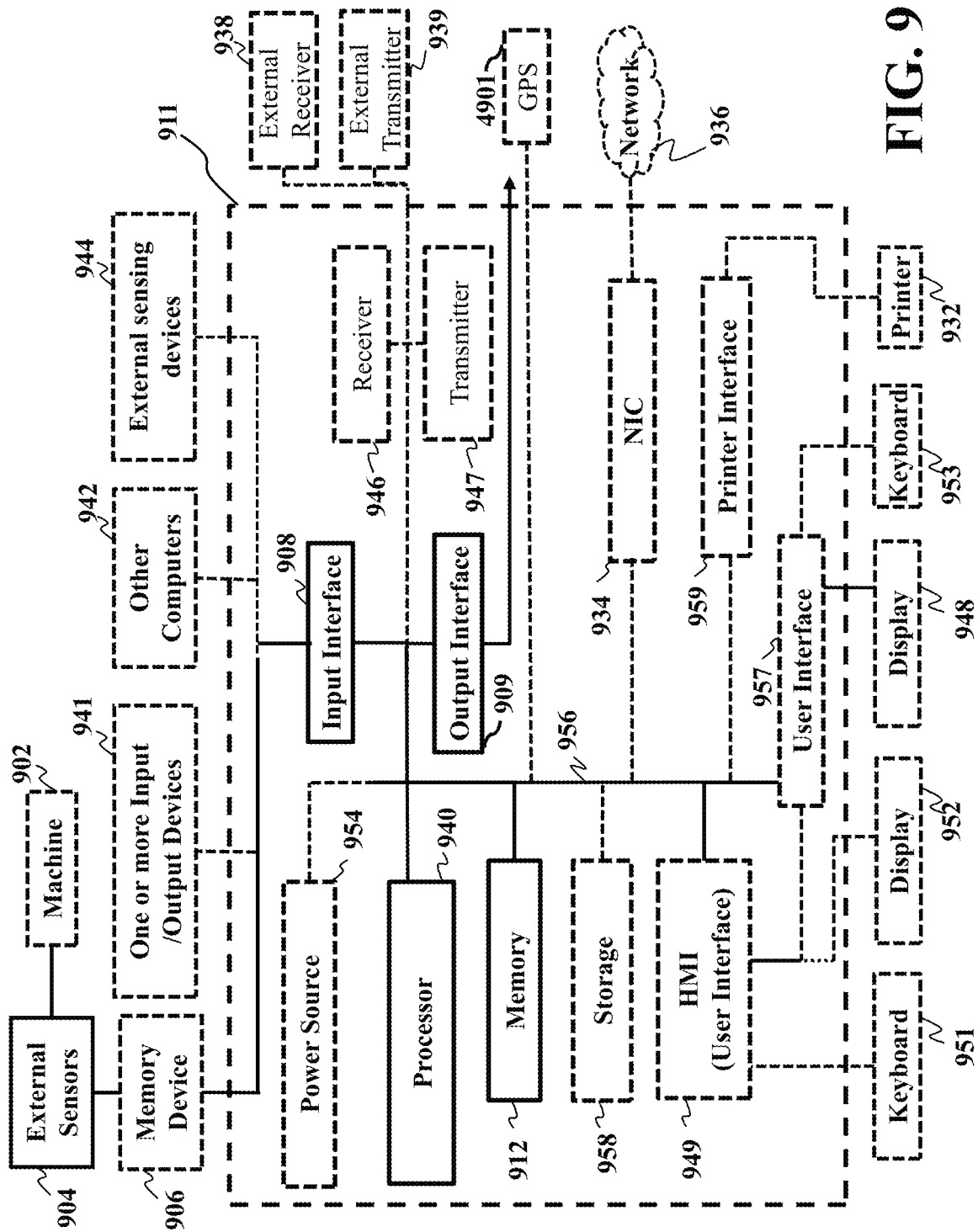
FIG. 9 is a block diagram of illustrating the method of FIG. 1A, that can be implemented using an alternate computer or processor, according to some embodiments of the present disclosure.

FIG. 9 is a block diagram of illustrating the method of FIG. 1A, that can be implemented using an alternate computer or processor, according to some embodiments of the present disclosure. For example, the computer 911 includes a processor 940, computer readable memory 912, storage 958 and user interface 949 with display 952 and keyboard 951, which are connected through bus 956. For example, the user interface 957 in communication with the processor 940 and the computer readable memory 912, acquires and stores the image data in the computer readable memory 912 upon receiving an input from a surface, keyboard 953, of the user interface 957 by a user.

The computer 911 can include a power source 954, depending upon the application the power source 954 may be optionally located outside of the computer 911. Linked through bus 956 can be a user input interface 957 adapted to connect to a display device 948, wherein the display device 948 can include a computer monitor, camera, television, projector, or mobile device, among others. A printer interface 959 can also be connected through bus 956 and adapted to connect to a printing device 932, wherein the printing device 932 can include a liquid inkjet printer, solid ink printer, large-scale commercial printer, thermal printer, UV printer, or dye-sublimation printer, among others. A network interface controller (NIC) 934 is adapted to connect through the bus 956 to a network 936, wherein image data or other data, among other things, can be rendered on a third-party display device, third party imaging device, and/or third-party printing device outside of the computer 911. The computer/processor 911 can include a GPS 901 connected to bus 956.

Still referring to FIG. 9, the image data or other data, among other things, can be transmitted over a communication channel of the network 936, and/or stored within the storage system 958 for storage and/or further processing. Further, the time series data or other data may be received wirelessly or hard wired from a receiver 946 (or external receiver 938) or transmitted via a transmitter 447 (or external transmitter 939) wirelessly or hard wired, the receiver 946 and transmitter 947 are both connected through the bus 956. The computer 911 may be connected via an input interface 908 to external sensing devices 944 and external input/output devices 941. The input interface 908 can be connected to one or more input/output devices 941, external memory 906, external sensors 904 which may be connected to a machine-like device 902. For example, the external sensing devices 944 may include sensors gathering data before-during-after of the collected time-series data of the machine. The computer 911 may be connected to other external computers 942. An output interface 909 may be used to output the processed data from the processor 940. It is noted that a user interface 949 in communication with the processor 940 and the non-transitory computer readable storage medium 912, acquires and stores the region data in the non-transitory computer readable storage medium 912 upon receiving an input from a surface 952 of the user interface 949 by a user.

FIG. 10A is a schematic illustrating that the touchless COP embodiments can be adapted to a dumbwaiter system, according to some embodiments of the present disclosure. FIG. 10B is a schematic illustrating that the touchless COP embodiments can be adapted to a moving sidewalk system, according to some embodiments of the present disclosure. FIG. 10C is a schematic illustrating that the touchless COP embodiments can be adapted to a wheelchair lift system, according to some embodiments of the present disclosure.

For example, FIG. 10A, FIG. 10B and FIG. 10C are schematics illustrating different embodiments that the touchless COP and touchless HOP that can be incorporated into different types of systems, a dumbwaiter system, a moving sidewalk system and a wheelchair lift system.

Features

An elevator system having a touchless elevator operating panel with buttons and an electronic circuit, the touchless elevator operating panel. The touchless elevator operating panel including a proximity sensor associated with an associated button and positioned proximate thereto. The proximity sensor arranged to generate a button detection zone around the associated button and detect a presence within the button detection zone. Wherein, when a detection is made by the proximity sensor regarding a presence of an object within the button detection zone in a time period, the electronic circuit receives proximity values about the detection from the proximity sensor. Wherein, the electronic circuit detects if activation of the proximity sensor is intentional or unintentional, based on inputting into an activation assessment module, the received proximity values and any other proximity values received from one or more other proximity sensors for the time period. Wherein, when a detection is made that the proximity sensor is intentionally activated regarding the presence of the object within the button detection zone. The electronic circuit generates and emits at least one command action including button information that is related to the associated button within the button detection zone to an elevator group control (EGC) unit. Contemplated is that the system, can include any combination of the different aspects listed below, regarding the above device. In particular, the following aspects are intended to either individually or in combination, create one or more embodiments based on the one or more combination of aspects listed below, for the above recited device.

An aspect can the activation assessment module includes the steps of identify a first and second highest proximity values and corresponding proximity sensor identifications from all proximity values received for the time period, that include the received proximity values and the any other proximity values received from the one or more other proximity sensors. Wherein the elevator operating panel is a hall call panel and the associated button is a direction button to make an elevator service request, or that the elevator operating panel is a car operating panel and the associated button is a floor selection button of the car operating panel. Apply a predetermined function to both the first and second highest proximity values, yielding a first comparison value and a second comparison value. Such that the first comparison value and the second comparison value have a decreased dependence on proximity sensor-specific characteristics when compared to the first and second highest proximity values. Subtract the first comparison value from the second comparison value to obtain a final test value. Wherein, if the final test value is greater than a predetermined final value threshold, then the detection is made that the proximity sensor is intentionally activated regarding the presence of the object within the button detection zone, the electronic circuit generates and emits the at least one command action including the button information that is related to the associated button within the button detection zone to the EGC unit.

An aspect is the at least on proximity sensor includes a near infrared (IR) transmitter and a near IR receiver, such that the near IR transmitter and the near IR receiver are configured to provide a proximity signal. Another aspect is that the proximity sensor is a type of proximity including one of, an ultrasonic proximity sensor, a pyroelectric proximity sensor, a thermal IR proximity sensor, a capacitive electric proximity sensor or a laser time-of-flight proximity sensor. Of which, an aspect is the obtaining and receiving of the proximity values for all proximity sensors are obtained based on the electronic circuit scanning and recording all the proximity sensor for the time period.

An aspect is that the sensor element sensor-specific characteristics include an amount of a sensor variance, an amount of an anomaly or an amount of an error, due to manufacture or to an amount of time of the sensor element operation. Another aspect is that each sensor element includes a confirmation lamp, such that the at least one command action includes a flash of the confirmation lamp, and the at least one command action includes a floor dispatch to the floor associated with the sensor element having the highest proximity value. Still, another aspect is each sensor element is designated to a digit number corresponding to digits in a multi-digit floor number touchless COP, such that a time delay is incorporated in an operating program of the CPU so leading zero digits of the multi-digit floor number are not entered.

An aspect can be that if the final test value is less than or equal to the predetermined final value threshold, then the object is considered as in the MSESD zone, and the electronic circuit does not generate or emit the at least one command action to the EGC unit. Another aspect is the operating panel is a hall call panel and the sensor element is a direction button to make an elevator service request. Yet another aspect is the operating panel is a car operating panel and the sensor element is a floor selection button of the car operating panel.

A touchless device for real-time contactless elevator service operation of an elevator, having an operating panel. The operating panel including a sensor array including sensor elements corresponding to floors serviced by the elevator. Each sensor element having a proximity sensor, such that a sensor detection zone of the proximity sensor senses by emitting proximity values indicative of an object positioned within the sensor detection zone to detect the object. An electronic circuit is configured to detect if the object is positioned in a single sensor element detection (SSED) zone, or if the object is positioned in multiple sensor elements sensor detection (MSESD) zone. Based on obtaining proximity values from all sensor elements in the sensor array. Input obtained proximity values from all sensor elements into a pretrained neural network (PNN). Evaluate each layer of the pretrained PNN beginning with an input layer through each intermediate layer, consecutively, and then to a final layer, to yield outputs of, a SSED zone value, a MSESD zone value, and a no zone (NZ) value which indicates neither the SSED, or MSESD zone values. If the SSED zone value is greater than the NZ value, and if the SSED zone value is greater than the MSESD zone value, then the object is considered as in the SSED zone, and the electronic circuit generates and emits at least one command action to an elevator group control (EGC) unit. Contemplated is that the system, can include any combination of the different aspects listed below, regarding the above device. In particular, the following aspects are intended to either individually or in combination, create one or more embodiments based on the one or more combination of aspects listed below, for the above recited device.

An aspect is that if the SSED zone value is less than or equal to the NZ value, then no action is taken such that the electronic circuit does not generate and emit the at least one command action to the EGC unit. Another aspect is if the SSED zone value is less than or equal to the MSESD value, then no action is taken such that the electronic circuit does not generate and emit the at least one command action to the EGC unit. Another aspect is the pretrained PNN is trained using training data obtained while training users are using a training touchless device. Such that the training data includes obtaining training proximity values from all training sensor elements in a training sensor array during a training period. Such that the training period includes intentional activations, unintentional activations and non-activation of the training sensor elements in the training sensor array.

SPEC—the training data includes intentional activations which are used to train the pretrained PNN to output a high value on the SSED zone value output and a low value on the MSESD zone and the NZ value outputs. Unintentional activations are used to train the pretrained PNN to output a high value on the MSESD zone value output and a low value on the SSED zone and the NZ value outputs. Non-activations values are used to train the pretrained PNN to output a high value on the NZ zone value output and a low value on the SSED zone and the MSESD value outputs.

Definitions

According to aspects of the present disclosure, and based on experimentation, the following definitions have been established, and certainly are not a complete definition of each phrase or term. Wherein the provided definitions are merely provided as an example, based upon learnings from experimentation, wherein other interpretations, definitions, and other aspects may pertain. However, for at least a mere basic preview of the phrase or term presented, such definitions have been provided. Further, the definitions below cannot be viewed as prior art since the knowledge gained is from experimentation only.

Proximity sensors: Proximity sensors, are non-contact position sensors that use a magnetic field for detection with the simplest magnetic sensor being the reed switch. In an inductive sensor, a coil is wound around an iron core within an electromagnetic field to form an inductive loop. For example, the proximity sensor often emits an electromagnetic field or a beam of electromagnetic radiation (infrared, for instance), and looks for changes in the field or return signal. The object being sensed is often referred to as the proximity sensor's target. Different proximity sensor targets demand different sensors. As an example, a capacitive proximity sensor or photoelectric sensor might be suitable for a plastic target; an inductive proximity sensor always requires a metal target. Proximity sensors can have a high reliability and long functional life because of the absence of mechanical parts and lack of physical contact between the sensor and the sensed object. Proximity sensors are also used in machine vibration monitoring to measure the variation in distance between a shaft and its support bearing. This is common in large steam turbines, compressors, and motors that use sleeve-type bearings. A proximity sensor adjusted to a very short range is often used as a touch switch. How used? Proximity sensors can be used to recognise air gestures and hover-manipulations. An array of proximity sensing elements can replace vision-camera or depth camera based solutions for hand gesture detection.

How does the proximity sensor work? The non-contact sensor proximity sensor detects the presence of an object (often referred to as the "target") when the target enters the sensor's field. Depending on the type of proximity sensor, sound, light, infrared radiation (IR), or electromagnetic fields may be utilized by the sensor to detect a target. Can the proximity sensor measure distance? A proximity sensor is a sensor able to detect the presence of nearby objects without any physical contact . . . . Proximity sensors are also used in machine vibration monitoring to measure the variation in distance between a shaft and its support bearing.

Monotonic increasing function: a monotonic function (or monotone function) is a function between ordered sets that preserves or reverses the given order. This concept first arose in calculus and was later generalized to the more abstract setting of order theory. In calculus, a function $f$ defined on a subset of the real numbers with real values is called monotonic if and only if it is either entirely non-increasing, or entirely non-decreasing. That is, a function that increases monotonically does not exclusively have to increase, it simply must not decrease.

The description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

What is claimed is:

1. An elevator system having a touchless elevator operating panel with buttons and an electronic circuit, the touchless elevator operating panel comprising:
    a proximity sensor associated with an associated button and positioned proximate thereto, the proximity sensor arranged to generate a button detection zone around the associated button and detect a presence within the button detection zone,
    wherein, when a detection is made by the proximity sensor regarding a presence of an object within the button detection zone in a time period, the electronic circuit receives proximity values about the detection from the proximity sensor, and
    wherein, the electronic circuit detects if activation of the proximity sensor is intentional or unintentional, based on inputting into an activation assessment module, the received proximity values and any other proximity values received from one or more other proximity sensors for the time period,
    wherein, when a detection is made that the proximity sensor is intentionally activated regarding the presence of the object within the button detection zone, the electronic circuit generates and emits at least one command action including button information that is related to the associated button within the button detection zone to an elevator group control (EGC) unit.

2. The elevator system of claim 1, wherein activation assessment module includes the steps of
    identify a first and second highest proximity values and corresponding proximity sensor identifications from all proximity values received for the time period, that include the received proximity values and the any other proximity values received from the one or more other proximity sensors,
    wherein the elevator operating panel is a hall call panel and the associated button is a direction button to make an elevator service request, or that the elevator operating panel is a car operating panel and the associated button is a floor selection button of the car operating panel;
    apply a predetermined function to both the first and second highest proximity values, yielding a first comparison value and a second comparison value, such that the first comparison value and the second comparison value have a decreased dependence on proximity sensor-specific characteristics when compared to the first and second highest proximity values; and
    subtract the first comparison value from the second comparison value to obtain a final test value, wherein, if the final test value is greater than a predetermined final value threshold, then the detection is made that the proximity sensor is intentionally activated regarding the presence of the object within the button detection zone, the electronic circuit generates and emits the at least one command action including the button information that is related to the associated button within the button detection zone to the EGC unit.

3. The elevator system of claim 1, wherein the at least on proximity sensor includes a near infrared (IR) transmitter and a near IR receiver, such that the near IR transmitter and the near IR receiver are configured to provide a proximity signal.

4. The elevator system of claim 1, wherein the proximity sensor is a type of proximity including one of, an ultrasonic proximity sensor, a pyroelectric proximity sensor, a thermal IR proximity sensor, a capacitive electric proximity sensor or a laser time-of-flight proximity sensor.

5. The elevator system of claim 1, wherein the obtaining and receiving of the proximity values for all proximity sensors are obtained based on the electronic circuit scanning and recording all the proximity sensor for the time period.

6. A touchless device for real-time contactless elevator service operation of an elevator having an operating panel, the operating panel including comprising:
  a sensor array including sensor elements corresponding to floors serviced by the elevator, each sensor element having a proximity sensor, such that a sensor detection zone of the proximity sensor senses by emitting proximity values indicative of an object positioned within the sensor detection zone to detect the object;
  an electronic circuit is configured to detect if the object is positioned in a single sensor element detection (SSED) zone, or if the object is positioned in multiple sensor elements sensor detection (MSESD) zone, based on
  obtain proximity values from all sensor elements in the sensor array;
  identify a first and second highest proximity values and corresponding sensor identifications from all sensor element proximity values of the sensor array;
  applying a predetermined function to both the first and second highest proximity values, yielding a first comparison value and a second comparison value, such that the first comparison value and the second comparison value have a decreased dependence on proximity sensor-specific characteristics when compared to the first and second highest proximity values; and
  subtracting the first comparison value from the second comparison value to obtain a final test value, such that if the final test value is greater than a predetermined final value threshold, then the object is considered as in the SSED zone, and the electronic circuit generates and emits at least one command action to an elevator group control (EGC) unit.

7. The touchless device of claim 6, wherein the sensor element sensor-specific characteristics include an amount of a sensor variance, an amount of an anomaly or an amount of an error, due to manufacture or to an amount of time of the sensor element operation.

8. The touchless device of claim 6, wherein each sensor element includes a confirmation lamp, such that the at least one command action includes a flash of the confirmation lamp, and the at least one command action includes a floor dispatch to the floor associated with the sensor element having the highest proximity value.

9. The touchless device of claim 6, wherein each sensor element is designated to a digit number corresponding to digits in a multi-digit floor number touchless COP, such that a time delay is incorporated in an operating program of the CPU so leading zero digits of the multi-digit floor number are not entered.

10. The touchless device of claim 6, wherein, that if the final test value is less than or equal to the predetermined final value threshold, then the object is considered as in the MSESD zone, and the electronic circuit does not generate or emit the at least one command action to the EGC unit.

11. The elevator system of claim 6, wherein the operating panel is a hall call panel and the sensor element is a direction button to make an elevator service request.

12. The elevator system of claim 6, wherein the operating panel is a car operating panel and the sensor element is a floor selection button of the car operating panel.

13. A method for real-time contactless elevator service operation of an elevator, comprising:
  using an operating panel having a sensor array with sensor elements corresponding to floors serviced by the elevator, such that each sensor element includes a proximity sensor with a sensor detection zone that senses by emitting proximity values indicative of an object positioned within the sensor detection zone to detect the object;
  detecting by an electronic circuit, if the object is positioned in a single sensor element detection (SSED) zone, or if the object is positioned in multiple sensor elements sensor detection (MSESD) zone, based on
  obtaining proximity values from all sensor elements in the sensor array by the electronic circuit, and identifying a first and second highest proximity values and corresponding sensor identifications from all sensor element proximity values of the sensor array;
  applying a predetermined function to both the first and second highest proximity values, yielding a first comparison value and a second comparison value, such that the first comparison value and the second comparison value have a decreased dependence on proximity sensor-specific characteristics when compared to the first and second highest proximity values; and
  subtracting the first comparison value from the second comparison value to obtain a final test value, such that if the final test value is greater than a predetermined final value threshold, then the object is considered as in the SSED zone, and the electronic circuit generates and emits at least one command action to an elevator group control (EGC) unit.

14. A non-transitory machine-readable medium including instructions stored thereon which, when executed by processing circuitry, configure the processing circuitry to perform operations for real-time contactless elevator service operation of an elevator, comprising:
  using an operating panel having a sensor array with sensor elements corresponding to floors serviced by the elevator, such that each sensor element includes a proximity sensor with a sensor detection zone that senses by emitting proximity values indicative of an object positioned within the sensor detection zone to detect the object;
  detecting by an electronic circuit, if the object is positioned in a single sensor element detection (SSED) zone, or if the object is positioned in multiple sensor elements sensor detection (MSESD) zone, based on
  obtaining proximity values from all sensor elements in the sensor array by the electronic circuit, and identifying a first and second highest proximity values and corresponding sensor identifications from all sensor element proximity values of the sensor array;
  applying a predetermined function to both the first and second highest proximity values, yielding a first comparison value and a second comparison value, such that the first comparison value and the second comparison value have a decreased dependence on proximity sensor-specific characteristics when compared to the first and second highest proximity values; and subtracting the first comparison value from the second comparison value to obtain a final test value, such that if the final test value is greater than a predetermined final value threshold, then the object is considered as in the SSED zone, and the electronic circuit generates and emits at least one command action to an elevator group control (EGC) unit.

15. A touchless device for real-time contactless elevator service operation of an elevator, having an operating panel, the operating panel including comprising:

a sensor array including sensor elements corresponding to floors serviced by the elevator, each sensor element having a proximity sensor, such that a sensor detection zone of the proximity sensor senses by emitting proximity values indicative of an object positioned within the sensor detection zone to detect the object;

an electronic circuit is configured to detect if the object is positioned in a single sensor element detection (SSED) zone, or if the object is positioned in multiple sensor elements sensor detection (MSESD) zone, based on obtain proximity values from all sensor elements in the sensor array;

input obtained proximity values from all sensor elements into a pretrained neural network (PNN);

evaluate each layer of the pretrained PNN beginning with an input layer through each intermediate layer, consecutively, and then to a final layer, to yield outputs of, a SSED zone value, a MSESD zone value, and a no zone (NZ) value which indicates neither the SSED, or MSESD zone values;

if the SSED zone value is greater than the NZ value, and if the SSED zone value is greater than the MSESD zone value, then the object is considered as in the SSED zone, and the electronic circuit generates and emits at least one command action to an elevator group control (EGC) unit.

16. The touchless device of claim 15, wherein if the SSED zone value is less than or equal to the NZ value, then no action is taken such that the electronic circuit does not generate and emit the at least one command action to the EGC unit.

17. The touchless device of claim 16, wherein if the SSED zone value is less than or equal to the MSESD value, then no action is taken such that the electronic circuit does not generate and emit the at least one command action to the EGC unit.

18. The touchless device of claim 15, wherein the pretrained PNN is trained using training data obtained while training users are using a training touchless device, such that the training data includes obtaining training proximity values from all training sensor elements in a training sensor array during a training period, such that the training period includes intentional activations, unintentional activations and non-activation of the training sensor elements in the training sensor array.

19. A touchless device for real-time contactless elevator service operation of an elevator, comprising:

an operating panel includes an array of elevator floor markers including a set of floor markers corresponding to floor numbers, wherein each floor marker includes a corresponding single marker element detection (SMED) zone;

a sensor array including a first sensor element and a second sensor element, wherein the first and the second sensor elements each include a sweep angle detection zone, such that each sweep angle detection zone cover the array of elevator floor markers;

a memory includes a first sensor element lookup table, the first sensor element lookup table contains one entry per possible sweep angle value produced by the first sensor element, each entry contains one coefficient per floor marker in the set of floor markers, and each coefficient corresponds to an amount of energy detected within a floor marker SMED zone at the possible sweep angle value by the first sensor element during intentional selection by a user of that floor marker, and a second sensor element lookup table, the second sensor element lookup table contains one entry per possible sweep angle value produced by the second sensor element, each entry contains one coefficient per floor marker in the set of floor markers, and each coefficient corresponds to an amount of energy detected within a floor marker SMED zone at the possible sweep angle value by the second sensor element during intentional selection by a user of that floor marker;

a second memory for the first sensor element having a storage location for each floor number and the corresponding SMED zone for the set of floor markers;

a third memory for the second sensor element having a storage location for each floor number and the corresponding SMED zone for the set of floor markers;

an electronic circuit is configured to detect if the object is positioned in a SMED zone, or if the object is positioned in multiple marker element detection (MSMED) zones, based on set all storage locations in the second memory and the third memory to zero;

scan and record sweep angle values from the first and the second sensor elements in the sensor array;

using the first sensor element lookup table, for each recorded first sensor element sweep angle value obtain a corresponding entry in the first sensor element lookup table, and for each coefficient in that entry, and set the corresponding storage location in the second memory from a current value to a maximum value of the current value stored in the second memory or the coefficient from the first sensor element lookup table;

using the second sensor element lookup table, for each recorded second sensor element sweep angle value obtain a corresponding entry in the second sensor element lookup table, and for each coefficient in that entry, and set the corresponding storage location in the third memory from a current value to a maximum value of the current value stored in the third memory or the coefficient from the second sensor element lookup table;

a fourth memory having a storage location for each floor number and corresponding SMED zone for the set of floor markers, wherein each storage location in the fourth memory is set to a value of a sum of the corresponding storage location in the second memory and the corresponding location in the third memory;

identify a first and second highest values in all the storage locations in the fourth memory; and subtract the second highest value from each of the value in each storage location in the fourth memory, if a result for any storage location is zero, then set that storage location to zero, wherein if any value remaining in each storage location of the fourth memory exceeds a final value threshold, then the detected user finger or user object is considered to be within the corresponding floor marker SMED zone corresponding to the floor number, and the electronic circuit generates and emits at least one command action to an elevator group control unit.

\* \* \* \* \*